(12) United States Patent
Kherani et al.

(10) Patent No.: US 11,472,373 B2
(45) Date of Patent: Oct. 18, 2022

(54) ENERGY CONTROL COATINGS, STRUCTURES, DEVICES, AND METHODS OF FABRICATION THEREOF

(71) Applicant: 3E NANO INC., Kitchener (CA)

(72) Inventors: Nazir Pyarali Kherani, Toronto (CA); Sai Shankar Balakrishnan, Kitchener (CA); Stepan Olegovich Fomichev, Vancouver (CA); Yufeng Ye, Toronto (CA); Remy Howard Haoching Ko, Toronto (CA); Daniel P. Shea, Richmond Hill (CA)

(73) Assignee: 3E NANO INC., Kitchener (CA)

( * ) Notice: Subject to any disclaimer, the term of this patent is extended or adjusted under 35 U.S.C. 154(b) by 576 days.

(21) Appl. No.: 16/605,948

(22) PCT Filed: Apr. 17, 2018

(86) PCT No.: PCT/CA2018/050461
§ 371 (c)(1),
(2) Date: Oct. 17, 2019

(87) PCT Pub. No.: WO2018/191817
PCT Pub. Date: Oct. 25, 2018

(65) Prior Publication Data
US 2020/0139935 A1    May 7, 2020

Related U.S. Application Data

(60) Provisional application No. 62/486,351, filed on Apr. 17, 2017.

(51) Int. Cl.
*B60S 1/02* (2006.01)
*B60J 1/00* (2006.01)
(Continued)

(52) U.S. Cl.
CPC ............... *B60S 1/026* (2013.01); *B60J 1/002* (2013.01); *B60J 1/02* (2013.01); *G02B 5/282* (2013.01); *H05B 3/84* (2013.01)

(58) Field of Classification Search
CPC ... B60S 1/026; B60J 1/002; B60J 1/02; G02B 5/282; G02B 5/285; G02B 5/281;
(Continued)

(56) References Cited

U.S. PATENT DOCUMENTS 4,421,622 A    12/1983 Hollars
4,859,532 A    8/1989 Oyama et al.
(Continued)

FOREIGN PATENT DOCUMENTS

CA    2247864 A1    3/1996
CN    101805891 A    8/2010
(Continued)

OTHER PUBLICATIONS

Boort et al., Philips Technical Review, vol. 29, 17-18 (1968).
(Continued)

*Primary Examiner* — Shawntina T Fuqua
(74) *Attorney, Agent, or Firm* — Hill & Schumacher

(57) ABSTRACT

Multilayer metallo-dielectric energy control coatings are disclosed in which one or more layers are formed from a hydrogenated metal nitride dielectric, which may be hydrogenated during or after dielectric deposition. Properties of the multilayer coating may be configured by appropriately tuning the hydrogen concentration (and/or the spatial profile thereof) in one or more hydrogenated metal nitride dielectric layers. One or more metal layers of the multilayer coating may be formed on a hydrogenated nitride dielectric layer, thereby facilitating adhesion of the metal with a low percolation threshold and enabling the formation of thin metal layers that exhibit substantial transparency in the visible (Continued)

spectrum. Optical properties of the coating may be tuned through modulation of metal-dielectric interface roughness and dispersion of metal nanoparticles in the dielectric layer. Electrical busbars and micro-nano electrical grids may be integrated with one or more metal layers to provide functionality such as de-icing and defogging.

48 Claims, 39 Drawing Sheets

(51) Int. Cl.
   *B60J 1/02*    (2006.01)
   *G02B 5/28*    (2006.01)
   *H05B 3/84*    (2006.01)
(58) Field of Classification Search
   CPC ...... G02B 1/12; H05B 3/84; H05B 2203/011;
              H05B 2203/013; C03C 2217/45; C03C
              2217/479; C03C 17/36; C03C 17/3613;
              C03C 17/3615; C03C 17/3626; C03C
              17/3639; C03C 17/3642; C03C 17/3644;
              C03C 17/366; C03C 17/3681; C23C
              14/0036; C23C 14/0641; B82Y 20/00;
              B32B 7/02
   See application file for complete search history.

(56) References Cited

U.S. PATENT DOCUMENTS

| | | | |
|---|---|---|---|
| 4,933,206 A | 6/1990 | Cox | |
| 4,965,121 A | 10/1990 | Young et al. | |
| 5,110,662 A | 5/1992 | Depauw et al. | |
| 5,332,888 A | 7/1994 | Tausch | |
| 5,344,718 A | 9/1994 | Hartig et al. | |
| 5,493,102 A | 2/1996 | Takase et al. | |
| 5,514,476 A | 5/1996 | Hartig et al. | |
| 5,563,734 A | 10/1996 | Wolfe et al. | |
| 5,750,267 A | 5/1998 | Takase et al. | |
| 5,935,702 A | 8/1999 | MacQuart et al. | |
| 5,946,601 A * | 8/1999 | Wong | H01L 23/5329 |
| | | | 148/DIG. 1 |
| 6,355,334 B1 | 3/2002 | Rondeau et al. | |
| 6,610,410 B2 | 8/2003 | Ebisawa et al. | |
| 6,764,579 B2 | 7/2004 | Veerasamy et al. | |
| 7,211,328 B2 | 5/2007 | Schicht et al. | |
| 7,709,095 B2 | 5/2010 | Persoone et al. | |
| 8,889,260 B2 | 11/2014 | Singh et al. | |
| 9,458,055 B2 | 10/2016 | Singh | |
| 9,561,981 B2 | 2/2017 | Mahieu et al. | |
| 2002/0192473 A1 | 12/2002 | Gentilhomme et al. | |
| 2011/0070417 A1 | 3/2011 | Reutler et al. | |
| 2013/0059137 A1 | 3/2013 | Hevesi et al. | |
| 2014/0177042 A1 | 6/2014 | Hassan et al. | |
| 2015/0070755 A1 | 3/2015 | Singh et al. | |
| 2015/0091116 A1 | 4/2015 | D'Aillon et al. | |
| 2015/0206989 A1 | 7/2015 | Wolke et al. | |
| 2016/0002101 A1 | 1/2016 | Mahieu et al. | |
| 2016/0298384 A1 | 10/2016 | You et al. | |
| 2018/0062008 A1 * | 3/2018 | Xie | C23C 14/16 |
| 2018/0267220 A1 * | 9/2018 | Frey | H01L 27/14621 |

FOREIGN PATENT DOCUMENTS

| | | |
|---|---|---|
| JP | 272669 A | 3/1990 |
| JP | 4232259 A | 8/1992 |
| JP | 6278244 A | 10/1994 |
| JP | 6338381 A | 12/1994 |
| JP | 1154620 A | 2/1999 |
| WO | 2016171779 A1 | 10/2016 |
| WO | 2016183691 A1 | 11/2016 |

OTHER PUBLICATIONS

Kostlin et al., Philips Technical Review, vol. 34, 242-243 (1974).
Fan et al., Appl. Opt. 15, 1012-1017 (1976).
Scalora et al., J. Appl. Phys. 83, 2377-2383 (1998).
Chiba et al., Appl. Surf. Sci. 246, 48-51 (2005).
Mahtani et al., Sol. Ener. Mat. & Sol. Cells 95, 1630-1637 (2011).
Ferrara et al., Sur. & Coat. Tech. 295, 2-7 (2016).
Mirpuri et al., J. Appl. Phys. 101, 024312-1-024312-8 (2007).
Cho et al., Electrochem. Solid-State Lett. 4, F7-F9 (2001).
Krugel et al., Rapid Res. Let. 7, 457-460 (2013).
Krugel et al., Energy Proc. 55, 797-804 (2014).
Ben et al., 2AV.1.27 Influence of Hydrogen Incorporation on the AlN Grown by RF Sputtering, EU PVSEC Conference (2016).
Wang et al., Langmuir 8, 1347-1353 (1992).
Yong et al., J. Vac. Sci. Tech A 15, 390-393 (1997).
International Search Report for the parent PCT/CA2018/050461 filed Apr. 17, 2018, dated Jul. 30, 2018.
Ali Serpenguzel et al., "Microcavity effects in the photoluminescence of hydrogenated amorphous silicon nitride", Proceedings of SPIE, vol. 3283, Jul. 7, 1998, p. 252.

* cited by examiner

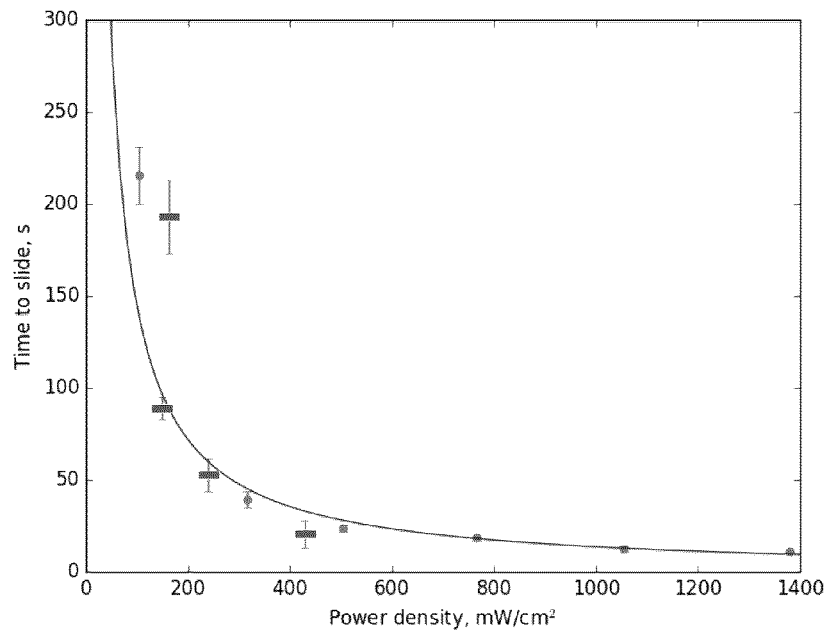
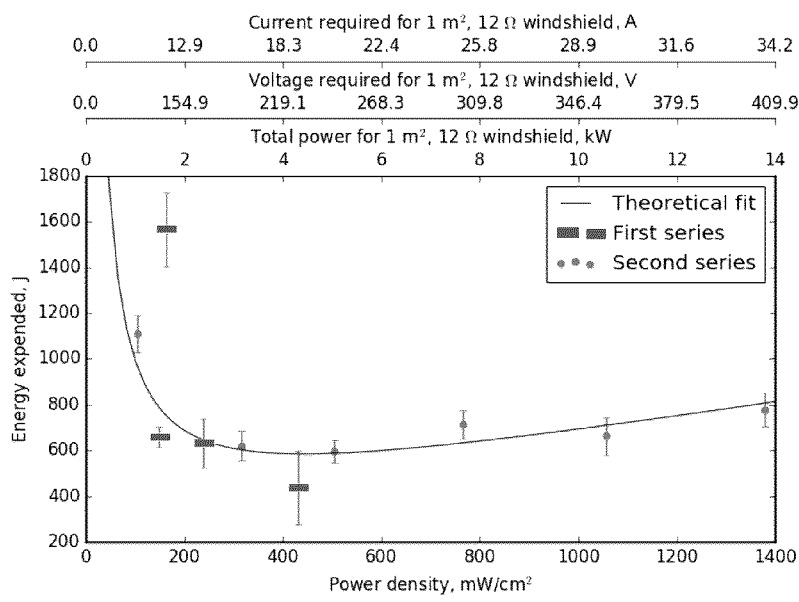

ENERGY CONTROL COATINGS, STRUCTURES, DEVICES, AND METHODS OF FABRICATION THEREOF

CROSS-REFERENCE TO RELATED APPLICATION

This application is a National Phase application claiming the benefit of the international PCT Patent Application No. PCT/CA2018/050461, filed on Apr. 17, 2018, in English, which claims priority to U.S. Provisional Application No. 62/486,351, titled "ENERGY CONTROL COATINGS, STRUCTURES, DEVICES, AND METHODS OF FABRICATION THEREOF" and filed on Apr. 17, 2017, the entire contents of which are incorporated herein by reference.

BACKGROUND

The present disclosure relates to optical coatings. More particularly, the present disclosure relates to optical coatings for low-emissivity or solar control windows.

Efficient, reliable and economic devices that enable effective control over the flow of optical, thermal and electrical energy are critical to achieving energy efficiency and desired passive and active functionalities in a variety of applications.

Perhaps one of the earliest energy control devices is the Dewar flask conceived by James Dewar, wherein the partially evacuated interspace between two flasks (one metal flask encapsulating another such that the two are only connected at the neck) served to significantly reduce heat transfer by conduction and convection [1]. The design subsequently evolved into a double glass wall Thermos, wherein the interspace is partially evacuated and the glass wall is coated with a low emissive metallic film [2]. Thereafter, Osram applied approximately a 50 nm thin gold film with an antireflective topcoat on a sodium glass lamp thereby achieving significant visible transparency, reflecting the thermal radiation back into the lamp, and thus increasing the lamp's energy efficiency [3]. Shortly after, this coating was superseded by a more transparent semiconductor tin oxide coating of approximately 320 nm thickness implemented by Philips [4,5]. Next, Kostlin reported the application of the tin oxide coat on the inner surfaces of a double glazed window and thus markedly reducing the radiative heat loss through a window [6]. Subsequently, Fan and Bachner reported the synthesis of tin doped indium oxide and titanium oxide/silver/titanium oxide multilayer metallo-dielectric coatings as effective heat mirrors and proposed the application of these and similar coatings for a variety of applications including "solar/thermal/electric conversion, solar heating, solar photovoltaic conversion, and window insulation" [7].

Since the work of Fan and Bachner, the field of metallo-dielectric based spectrally selective coatings has been developed extensively, leading to the design of a variety of multilayer coatings comprising a range of dielectrics and metals with the objective of achieving modulation over the visible, near infrared, and mid-infrared parts of the optical electromagnetic spectrum [8-24]. Dielectric layers have included a range of metal oxides, metal nitrides, metal oxynitrides, silicon oxide, silicon oxynitride, silicon nitride, silicon carbide, amorphous silicon and amorphous carbon. With regard to metals, silver has been the predominant choice when considering optical properties. Other metals have been used in functional ways such as seed layers to promote the adhesion of silver or buffer/blocking layers to protect the silver layer from impurity diffusion and oxidation. Moreover, metal and metal alloy layers have also been used as tuning layers; for example, to meet transmissive and/or reflective colour requirements, as well as optical performance stability requirements vis-à-vis tempering (thermal treatment) needs.

Dielectrics have been used for purposes other than optical modulation, such as oxygen and moisture protection and improved adhesion of the metal to the underlying substrate. These structures have evolved into a multitude of multilayer coatings with the inevitable use of many different materials, and different deposition processes. The increase in design and fabrication complexities pose a challenge to effectively and concurrently address numerous functional requirements while facing the demand of coating economics.

SUMMARY

In various example embodiments of the present disclosure, multilayer metallo-dielectric energy control coatings are disclosed in which one or more layers are formed from a transparent hydrogenated metal nitride dielectric. The hydrogenated metal nitride dielectric may be hydrogenated during or after dielectric deposition. One or more properties of the multilayer coating can be improved or configured by appropriately tuning the hydrogen concentration (and/or the spatial profile thereof) in one or more hydrogenated metal nitride dielectric layers. One or more metal layers of the multilayer coating may be formed on a hydrogenated nitride dielectric layer to facilitate adhesion of the metal and enable the formation of thin metal layers that exhibit substantial transparency in the visible spectrum. In some example embodiments, hydrogenation of a dielectric layer or a multilayer coating post-deposition can be carried out at various temperatures and durations using pure hydrogen gas or gases (such as inert gases (for example, Ar), or nitrogen, or other gases) containing molecular hydrogen. Post-deposition hydrogenation can also be carried out using atomic hydrogen. These post-deposition treatments at elevated temperatures can also be used to improve or maintain multilayer coating properties while concurrently shaping the substrate (for example, bending of glass). Additionally, other transparent dielectric layer(s) can also be incorporated as an encapsulative layer and/or to improve the multilayer coating properties. Further, the optical properties can be tailored through plasmonic resonances by engineering nanostructures in the metal film or by incorporating metallic nanostructures in the transparent dielectric film. Electrical busbars may be integrated with one or more metal layers to provide functionality such as de-icing and defogging. Micro/nano-thick metal grid lines invisible to the human eye may be connected to the busbars without rendering substantial change in optical performance and to raise power density levels while operating within the voltage rating of available power supplies.

Accordingly, in a first aspect, there is provided a metallo-dielectric solar control structure comprising:
a transparent substrate;
a multilayer metallo-dielectric coating formed on said transparent substrate, said multilayer metallo-dielectric coating comprising the following sequence of layers:
   a first transparent dielectric layer formed on said transparent substrate;
   a metal layer formed on said first transparent dielectric layer; and
   a second transparent dielectric layer formed on said metal layer;

wherein at least one of said first transparent dielectric layer and said second transparent dielectric layer is a hydrogenated metal nitride dielectric layer; and wherein said metal layer is sufficiently thin, and wherein each hydrogenated metal nitride dielectric layer comprises an effective hydrogen concentration, such that said structure exhibits transparency of at least 70% in at least a portion of the visible spectrum.

In another aspect, there is provided a method of fabricating a metallo-dielectric coating on a transparent substrate, the method comprising:

depositing, onto the transparent substrate, a first transparent dielectric layer;

depositing a metal layer onto the first transparent dielectric layer such that the metal layer forms a continuous film in the absence of isolated islands; and depositing a second transparent dielectric layer onto the metal layer;

wherein at least one of said first transparent dielectric layer and said second transparent dielectric layer is a hydrogenated metal nitride dielectric layer formed by the deposition of a metal nitride layer in the presence of hydrogen;

wherein a thickness of the metal layer, and a hydrogen concentration of each hydrogenated metal nitride dielectric layer, are selected such that the metallo-dielectric coating exhibits a transparency of at least 70% in at least a portion of the visible spectrum.

In another aspect, there is provided a method of fabricating a metallo-dielectric coating on a transparent substrate, the method comprising:

depositing, onto the transparent substrate, a first transparent dielectric layer;

depositing a metal layer onto the first transparent dielectric layer such that the metal layer forms a continuous film in the absence of isolated islands; and depositing a second transparent dielectric layer onto the metal layer;

wherein at least one of said first transparent dielectric layer and said second transparent dielectric layer is a metal nitride dielectric layer;

performing post-deposition hydrogenation such that at least one metal nitride dielectric layer becomes a hydrogenated metal nitride dielectric layer;

wherein a thickness of the metal layer, and a hydrogen concentration of each hydrogenated metal nitride dielectric layer, are selected such that the metallo-dielectric coating exhibits a transparency of at least 70% in at least a portion of the visible spectrum.

In another aspect, there is provided a metallo-dielectric solar control structure comprising:

a transparent substrate;

a multilayer metallo-dielectric coating formed on said transparent substrate, said multilayer metallo-dielectric coating comprising the following sequence of layers:

a first transparent dielectric layer formed on said transparent substrate;

a metal layer formed on said first transparent dielectric layer; and a second transparent dielectric layer formed on said metal layer;

wherein at least one of said first transparent dielectric layer and said second transparent dielectric layer is a hydrogenated metal nitride dielectric layer.

BRIEF DESCRIPTION OF THE DRAWINGS

Embodiments will now be described, by way of example only, with reference to the drawings, in which:

FIGS. 28A and 28B illustrate the defrosting performance of an example metallo-dielectric coating on glass, where FIG. 28A plots the dependence of the time for ice on slightly-inclined glass to slide on the power density, and FIG. 28B plots the dependence of expended energy on power density.

FIGS. 29B-D show the simulated spatial dependence of the fogged areas at three different time points.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean plus or minus 25 percent or less.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

Figure 1:
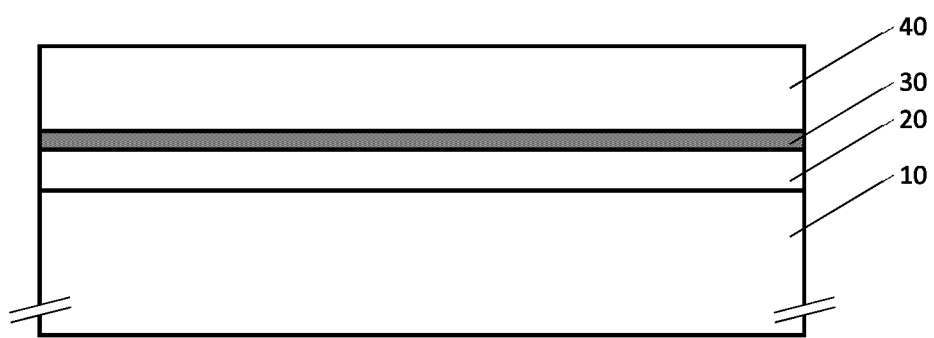
FIG. 1 illustrates an example embodiment of a metallo-dielectric multilayer coating on a substrate with a metal layer provided between uniform dielectric layers.

Referring now to FIG. 1, an example of a conventional metallo-dielectric multilayer solar control structure is illustrated. The multilayer structure includes a transparent substrate 10 and a multilayer metallo-dielectric coating formed thereon. The multilayer metallo-dielectric includes a first (underlying) dielectric layer 20, a metal layer 30, and a second (overlying) dielectric layer 40. The metal layer 30 is sufficiently thin to permit transmission within the visible spectrum (400-700 nm), while also exhibiting substantial reflectivity in the infrared.

The present inventors have discovered that the properties and performance of such a metallo-dielectric structure can be improved when one or more of the dielectric layers is provided as a hydrogenated metal nitride dielectric layer. In various example embodiments of the present disclosure, multilayer metallo-dielectric energy control coatings are disclosed in which one or more layers are formed from a hydrogenated metal nitride dielectric. As described in detail below, properties of such a multilayer coating can be improved or selected by appropriately tuning the hydrogen concentration (and/or the spatial profile thereof) in one or more hydrogenated metal nitride dielectric layers. In some example embodiments, at least one metal layer of the multilayer coating may be formed on a respective hydrogenated metal nitride dielectric layer. As will be described below, the hydrogenated metal nitride dielectric layer provides a substrate that facilitates adhesion of the metal and a low percolation threshold to enable the formation of thin metal layers that exhibit substantial transparency in the visible spectrum.

Figure 2:
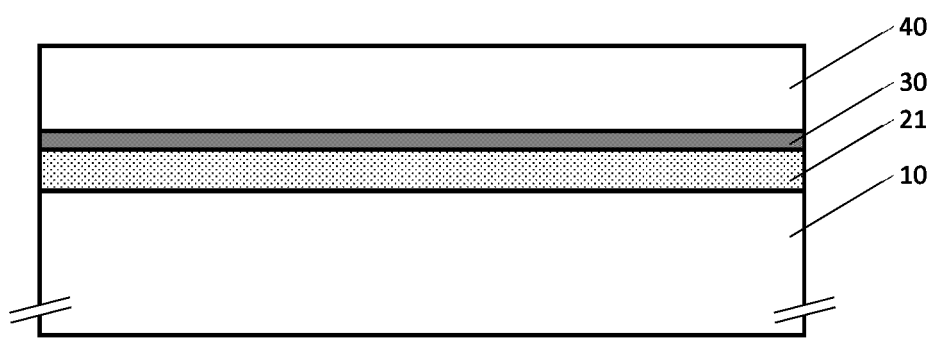
FIG. 2 illustrates an example embodiment of a metallo-dielectric multilayer coating on a substrate with an underlying hydrogenated metal nitride dielectric layer.

Referring now to FIG. 2, an example embodiment of a multilayer metallo-dielectric stack is illustrated in which one of the dielectric layers is a hydrogenated metal nitride dielectric layer. In the example embodiment shown, the underlying dielectric layer (underlying the metallic layer 30) that is formed on the transparent substrate 10 is provided as a hydrogenated metal nitride dielectric layer 21. The middle-lying metallic layer 30 is formed on the hydrogenated metal nitride dielectric layer 21. An overlying dielectric layer 40, which may also be a hydrogenated metal nitride dielectric layer, is provided above the metallic layer 30.

The hydrogenated metal nitride dielectric layer may be amorphous, crystalline, or both amorphous and crystalline. Non-limiting examples of the hydrogenated metal nitride dielectric include hydrogenated aluminum nitride, hydrogenated titanium nitride, and hydrogenated titanium aluminum nitride. The overlying dielectric layer 40 may be, for example, a metal nitride, such as aluminum nitride or titanium nitride or titanium aluminum nitride. The hydrogenated metal nitride dielectric layer may be uniformly hydrogenated, as shown in FIG. 2, or hydrogenated in a manner that results in a spatially-dependent hydrogen concentration, as described in further detail below. As described in detail below, it has been found that by controlling the hydrogen inclusion in the metal nitride dielectric layer, it is possible to control, select and/or optimize optical, physical and chemical properties of the layer and the overall metallo-dielectric structure.

The middle-lying metallic layer 30 is a metal such as silver. Other suitable metals include, but are not limited to, copper, aluminum, gold and metal alloys ("metal", as used herein, refers both to elemental metals and metal alloys).

The substrate 10 may be any suitable transparent dielectric, such as, but not limited to, flexible films/foils/sheets, such as polymer films/foils/sheets formed from materials including polyethylene terephthalate, polycarbonate, polyimide, and polyvinyl butyral (for example, processed in a roll-to-roll sputter deposition system); and, rigid substrates, such as polycarbonate and glass sheets (glazings) (for example, processed in an in-line or shuttle sputter deposition system).

The thicknesses of the dielectric layers 21 and 40 and metal layer 30 may be selected to exhibit suitable optical and electrical properties, including, for example, optical properties such as, but not limited to, transmissivity in the visible, reflectivity in the near infrared, and emissivity in the mid-infrared, and electrical properties such as, but not limited to, electrical conductivity and sheet resistance. Example thickness ranges for the hydrogenated metal nitride dielectric layer include, but are not limited to, 10 nm to 100 nm. Example thickness ranges for the metal layer include, but are not limited to, 3 nm to 30 nm.

In some example implementations, the layers may be formed via sputter deposition. Such a process may be performed at ambient, near-ambient or low (e.g., 50° C. to 200° C.) temperatures. The dielectric layers, including the hydrogenated metal nitride layer, may be deposited through reactive sputtering. For example, aluminum nitride films may be deposited using reactive sputtering of aluminum with argon and nitrogen sputter gases. Aluminum nitride films with varying grain sizes are usually obtained by varying the substrate temperature.

As described in detail below, various properties (e.g. physical, chemical and optical properties, such as, but not limited to, refractive index and extinction coefficient) of the hydrogenated metal nitride dielectric, and various aspects of the interaction of the hydrogenated metal nitrate dielectric with other layers, such as the metal layer and/or the transparent substrate (e.g. adhesion, passivation, barrier protection against moisture and/or oxygen), may be controlled, tuned, modulated, selected, or otherwise varied by controlling the addition of hydrogen, such as via controlling the addition of hydrogen gas during reactive sputter deposition, in addition to the usual deposition parameters of power, precursor gas flow rates—typically argon and nitrogen, chamber pressure, and substrate temperature. Additionally or alternatively, the properties of the hydrogenated metal nitride dielectric can be tuned through the addition of atomic or/and ionic hydrogen source at the growth surface during the sputter deposition process. In yet another example implementation, the properties of the hydrogenated metal nitride dielectric can be tuned following sputter deposition by exposing the layer to an atomic or/and ionic hydrogen source. In example embodiments involving multiple hydrogenated metal nitride dielectric layers, any one or more of the layers may be tuned to serve one or more functions, and collectively render purposeful multilayer coatings.

In one example implementation, hydrogen is incorporated into a metal nitride dielectric layer, during growth by sputtering, by providing hydrogen gas having a concentration ranging between 0.25% and 2.5% by volume, or 0.5% and 5% by volume, or 0.5% and 10% by volume, or 1% and 10% by volume, or 0.5% and 20% by volume.

In one example implementation, hydrogen is incorporated into a metal nitride dielectric layer, either during or post growth, at a concentration ranging between 1 ppm and 1000 ppm, or 1 ppm and 10,000 ppm, or 10 ppm and 10,000 ppm, or 100 ppm and 100,000 ppm by weight.

As described in the examples provided below, the addition of elemental hydrogen gas, having a range of concentrations, in a low-temperature sputter deposition process, has been found to produce a range of hydrogenated aluminum nitride (AlN:H) films that exhibit a corresponding range of physical, chemical and optical properties. In an alternative approach, the addition of atomic and/or ionic hydrogen flux at various levels at the film growth surface equivalently leads to a range of hydrogenated aluminum nitride films that exhibit a corresponding range of physical, chemical and optical properties.

In yet another approach, exposing an aluminum nitride film, post-deposition, to a range of atomic or, and ionic hydrogen flux at various levels and varying exposure duration equivalently leads to a range of hydrogenated aluminum nitride films that exhibit a corresponding range of physical, chemical and optical properties.

In some example embodiments, hydrogenation of a dielectric layer or a multilayer coating post-deposition can be carried out at various temperatures and durations using pure hydrogen gas or gases (such as inert gases (for example, Ar), or nitrogen, or other gases) containing molecular hydrogen. Post-deposition hydrogenation can also be carried out using atomic hydrogen. These post-deposition treatments at elevated temperatures can also be used to improve or maintain multilayer coating properties while concurrently shaping the substrate (for example, bending of glass). Additionally, other transparent dielectric layer(s) can also be incorporated as an encapsulative layer and/or to improve the multilayer coating properties.

In some example embodiments, the hydrogen concentration (either an in-process concentration such as the concentration of hydrogen gas, or a post-deposition concentration of hydrogen in the hydrogenated metal nitride dielectric layer) is selected or controlled such that the refractive index of the hydrogenated metal nitride dielectric layer lies between approximately 1.5 and 1.7, or between approximately 1.6 and 1.8, or between approximately 1.5 and 1.8 or between approximately 1.7 and 2.1 or between approximately 1.6 and 2.1, or between approximately 1.5 and 2.1 in the visible spectrum.

In some example embodiments, the hydrogen concentration (either an in-process concentration such as the concentration of hydrogen gas, or a post-deposition concentration of hydrogen in the hydrogenated metal nitride dielectric layer) and the thickness of the metal layer deposited on the hydrogenated metal nitride dielectric layer, (and optionally the number of metal-dielectric bilayers) are selected or controlled such that the metallo-dielectric structure exhibits transparency of at least 70%, or at least 75%, or at least 80%, or at least 85% in at least a portion of the visible spectrum. In one example implementation, the hydrogen concentration (either an in-process concentration such as the concentration of hydrogen gas, or a post-deposition concentration of hydrogen in the hydrogenated metal nitride dielectric layer) and the thickness of the metal layer deposited on the hydrogenated metal nitride dielectric layer, (and optionally the number of metal-dielectric bilayers) are selected or controlled such that the metallo-dielectric structure exhibits transparency of at least 70% in at least a portion of the visible spectrum and reflectivity of at least 70% in at least a portion of the infrared spectrum.

In some example embodiments, the hydrogen concentration (either an in-process concentration such as the concentration of hydrogen gas, or a post-deposition concentration of hydrogen in the hydrogenated metal nitride dielectric layer) is selected or controlled such that the extinction coefficient of the hydrogenated metal nitride dielectric layer lies: between (i) 0 and 0.15 or between 0 and 0.07 for wavelengths between 200 nm to 400 nm; and (ii) between 0 and 0.02 or between 0 and 0.05 for wavelengths in the visible spectrum between 400 nm and 700 nm.

In some example embodiments, the hydrogen concentration (either an in-process concentration such as the concentration of hydrogen gas, or a post-deposition concentration of hydrogen in the hydrogenated metal nitride dielectric layer) and the thickness of the metal layer deposited on the hydrogenated metal nitride dielectric layer are selected or controlled such that the resistivity (at room temperature) of the metal layer lies between about 2 $\mu\Omega$ cm and 6 $\mu\Omega$ cm, or between 6 $\mu\Omega$ cm and 10 $\mu\Omega$ cm, or between 10 $\mu\Omega$ cm and 20 $\mu\Omega$ cm, between 2 $\mu\Omega$ cm and 20 $\mu\Omega$ cm, or between 2 $\mu\Omega$ cm and 10 $\mu\Omega$ cm.

In some example embodiments, the hydrogen concentration (either an in-process concentration such as the concentration of hydrogen gas, or a post-deposition concentration of hydrogen in the hydrogenated metal nitride dielectric layer) is selected or controlled such that the average grain size of the hydrogenated metal nitride dielectric layer lies between 30 and 100 nm, or between 5 and 30 nm, or between 5 and 100 nm, or is less than 100 nm, less than 30 nm, or 5 nm. Further, in certain embodiments sufficient process concentration of hydrogen gas is used to create an amorphous hydrogenated aluminum nitride network absent of nanocrystallites.

In some example embodiments, the hydrogen concentration (either an in-process concentration such as the concentration of hydrogen gas, or a post-deposition concentration of hydrogen in the hydrogenated metal nitride dielectric layer) is selected or controlled such that a full width half maximum of a distribution of the size of surface feature/grain protrusions in growth direction (i.e. the vertical direction/z-direction), of the hydrogenated metal nitride dielectric layer lies between 3 and 5 nm, or between 2 and 3 nm, or between 1 and 2 nm, or is less than 5 nm, less than 4 nm, less than 3 nm, less than 2.5 nm, less than 2 nm, or less than 1 nm.

The hydrogen concentration of the hydrogenated metal nitride dielectric layer 21 may be selected to promote overtop the growth of a smooth (continuous) metal film, such that the metal layer 30 is absent of isolated islands while being sufficiently thin to exhibit transmission in the visible spectrum (e.g. transmission of at least 70%, or at least 75%, or at least 80%, or at least 85% in at least a portion of the visible spectrum) and enhanced electrical conductivity. Accordingly, in one example implementation, for a given selected metal layer and a given selected metal nitride, the hydrogen concentration may be varied (e.g. indirectly via varying the amount of hydrogen present during the hydrogenation process, such as varying a volume fraction of hydrogen gas), in order to identify suitable conditions for the growth of a thin yet island-free metal layer.

Without intending to be limited by theory, it is believed that the presence of hydrogen in the hydrogenated metal nitride layer may also be beneficial for enhancing adhesion of the metal nitride dielectric layer with the transparent substrate 10. Accordingly, in one example implementation, for a given selected transparent substrate and a given selected metal nitride, the hydrogen concentration may be varied (e.g. indirectly via varying the amount of hydrogen present during the hydrogenation process, such as varying a volume fraction of hydrogen gas), in order to identify suitable conditions that achieve satisfactory adhesion of the hydrogenated metal nitride dielectric layer to the transparent substrate.

Without intending to be limited by theory, it is also believed that the hydrogenated metal nitride dielectric may also provide a dense and tight network with appropriate formation of hydroxide and oxide at the underlying interface between the hydrogenated metal nitride dielectric and the transparent substrate. This dense and tight network may thus serve as an effective and robust barrier to permeation of moisture and oxygen from the underlying transparent substrate, especially in the case of permeable polymeric materials. Accordingly, in one example implementation, for a given selected transparent substrate and a given selected metal nitride, the hydrogen concentration may be varied (e.g. indirectly via varying the amount of hydrogen present during the hydrogenation process, such as varying a volume fraction of hydrogen gas), in order to identify suitable conditions that achieve satisfactory barrier protection against permeation of moisture and/or oxygen from the transparent substrate.

It is noted further that the presence of hydrogen at varying concentrations during the growth of a metal nitride dielectric layer can provide a variety of potentially beneficial effects. For example, without intending to be limited by theory, it is believed that the presence of hydrogen during layer formation can provide passivation of atomic scale defects, altering the grain size, changing the physical structure—from crystalline to amorphous, modifying the surface properties, adjusting the chemical environment. Some of the implications of these changes include enhanced optical transmittance and reduced extinction coefficient which in a given optical device design can enhance performance through improved visible transmittance, increased infrared reflectance, and better clear-neutrality and light-to-solar gain.

The inclusion of hydrogen also leads to a more electrically resistive network, likely an outcome of passivation of dangling bonds and commensurate mitigation of defect enabled charge hopping. For example, this in turn can play into alleviating Ag island formation, lower the percolation threshold and thus promote a smoother metallic (e.g. silver) film. Further appropriate level of hydrogenation can also lead to enhanced adhesion, between the metal (e.g. silver) layer and the dielectric film as well as between the dielectric film and the underlying substrate. Moreover, appropriate levels of hydrogen can also lead to film stress relaxation. Hydrogenation also enables modulation of film hardness.

Yet another example use of preceding example embodiments involves the use of hydrogenated metal nitrides, hydrogenated in-process or post-deposition, to render a spectrally selective coating, which following exposure to air provides inherent resistance and stability, through the natural formation of oxynitrides and hydroxides, against oxidation or corrosion of the metal (for example, Ag).

Yet another variation of preceding example embodiments includes a spectrally selective coating where another transparent dielectric is deposited above the metallo-dielectric coating to provide additional/secondary encapsulation. Potential transparent dielectrics include, but are not limited to, alkali halides (for example, $MgF_2$) and other large bandgap ceramics (for example, nitrides, metal oxynitrides, or hydrogenated metal oxynitrides).

Yet another variation of preceding example embodiments includes the deposition of transparent dielectric layer(s), or thin (for example, 0.05 nm to 3 nm) metallic layer(s), on or/and below the metal layer so as to serve as an encapsulative layer(s) or/and as a layer(s) enhancing the properties of the multilayer coating.

In another example embodiment, the top most dielectric layer, when provided as an appropriately hydrogenated metal nitride layer, may readily lead to the formation of hydroxide and oxide upon exposure to ambient oxygen and moisture. Aluminum hydroxide readily forms at the active grain boundary sites and given its larger lattice constant will tend to fill any voids in the structure. Aluminum also readily forms a native oxide. The combination of both aluminum oxide and aluminum hydroxide may therefore render a robust permeation barrier to oxygen and moisture permeation.

Without intending to be limited by theory, it is also believed that hydrogenated metallic film, where the hydrogen concentration (either an in-process concentration such as the concentration of hydrogen gas, or a post-deposition concentration of hydrogen in the hydrogenated metallic layer), may lead to the modulation of the metallic film properties. It is believed that the hydrogen may serve to passivate active electronic sites and thus ameliorate the electrical conductivity of the network. Further, it is believed that the hydrogen may affect the growth of metallic films, influencing the grain structure, and thus its properties. Accordingly, in one example implementation, for a given selected metal layer and a given selected metal nitride, the hydrogen concentration may be varied (e.g. indirectly via varying the amount of hydrogen present during the hydrogenation process, such as varying a volume fraction of hydrogen gas), in order to identify suitable conditions for the enhanced properties (for example, optical transmittance, electrical conductivity, etc.) of a thin yet island-free metal layer.

The variety of embodiments of metallo-dielectric multilayer stacks, including those described herein, can be produced, for example, in roll-to-roll or in-line/shuttle manufacturing systems, wherein the roll-to-roll system is typically used to deposit the multilayer coatings on flexible films/foils while the in-line/shuttle system is typically used to deposit the multilayer coatings on rigid sheets. In a roll-to-roll system, the flexible film/substrate is typical of some width, the film width being, for example, 1.6 m or 2.1 m, and the film is on a roll wherein the film is of some length, the web length (for example, 1 or more kilometres).

In an example roll-to-roll manufacturing system, the deposition of a metallo-dielectric multilayer stack, for example a hydrogenated aluminum nitride—silver—hydrogenated aluminum nitride device, could include three sequential deposition zones. In the dielectric film deposition zone, an RF or DC or pulsed RF or DC magnetron reactive sputter deposition of hydrogenated aluminum nitride could be carried out using various standard techniques of reactive sputter deposition of aluminum nitride along with introduction/injection of hydrogen in the deposition zone. Alternatively, DC sputtering or low-medium frequency sputtering can be used.

In one example configuration, molecular hydrogen gas is introduced/injected at or near the film growth surface where the plasma extending from the aluminum target would optimally interact with the molecular hydrogen, thereby enabling the dissociation of molecular hydrogen into hydrogen atoms and ions, which in turn are chemically integrated in the growth of the hydrogenated aluminum nitride dielectric film. In another example configuration, hydrogen gas is added at an appropriate volumetric concentration within the sputter gas, such as an argon-nitrogen mixture, and thus leads to reactive sputter deposition of hydrogenated aluminum nitride film. In yet another example configuration, hydrogen is introduced/injected at the film growth surface and added to the sputter gas, at appropriate levels, to produce the hydrogenated aluminum nitride film. In yet another configuration, an atomizer/ionizer is used to introduce/inject atomic hydrogen and, or ionic hydrogen at or near the growth surface, and thus lead to growth of hydrogenated aluminum nitride film. In the latter configuration, an atomizer/ionizer would comprise of a hydrogen glow discharge that appropriately feeds/injects atomic and, or ionic hydrogen at or near the film growth surface. The hydrogen glow discharge can be produced using appropriate RF, DC, pulsed or microwave plasma configurations. Similar hydrogen introduction measures can be integrated for the metallic film deposition zone.

In one example implementation, within a given deposition zone in a roll to roll manufacturing system, hydrogen injectors may be uniformly distributed laterally, that is along the web width, thereby ensuring uniformity in gas/plasma chemistry along the width and hence contributing to attaining uniformity in the properties of the resulting film along the entire width of the film. Further, in the simplest of configurations, an appropriate density of hydrogen injectors may be distributed longitudinally, that is along the direction of motion of the web, thereby providing uniformity in deposition of the hydrogenated aluminum nitride films in relation to the deposition zone.

In an alternative configuration, the hydrogen injectors may be subdivided into two banks longitudinally thereby enabling the injection of hydrogen (molecular or, and atomic or, and ionic) at two different concentrations longitudinally and thus resulting in two quasi-continuous regions of the hydrogenated aluminum nitride film in relation to the hydrogen concentration. In yet another configuration, the hydrogen injectors may be subdivided appropriately to attain a gradient in hydrogen concentration in relation to the longitudinal direction, and thus result in an hydrogenated aluminum nitride film with an essentially continuously graded hydrogen concentration. Similar techniques can be used in controlling the hydrogen concentration in the deposition zones for the metallic film and accordingly modulating the properties of the metallic film.

In an in-line/shuttle manufacturing system, similar methods to those described above can be used to introduce the hydrogen and thus effect the desired modulation in film properties.

Additionally, in an in-line/shuttle manufacturing system, hydrogenation could be carried out post-deposition. For example, a three-layer stack could include deposition of aluminium nitride, silver, and aluminum nitride in sequential deposition zones; and thereafter, the multilayer stack would be treated with gases (such as Ar, $N_2$, other) containing hydrogen. Further, the post-deposition treatment could occur at an elevated temperature to improve properties of the multilayer coating. Moreover, the temperature could be elevated to a sufficiently high level to achieve substrate shaping (for example, bending of glass) while maintaining coating properties or improving coating properties. An example gas is forming gas, comprising principally of nitrogen with a small concentration of hydrogen; in this case, the presence of nitrogen can also serve to 'repair' or 'heal' any imperfections in the aluminum nitride film while the hydrogen can play the role of passivating dangling bonds as well as providing a reducing environment during the overall process so as to mitigate or eliminate any oxidation of the metal and dielectric films.

In some example embodiments described below, the metal film deposited on the hydrogenated metal nitride dielectric layer may be patterned. In one example implementation for facilitating such patterning, laser ablation sub-systems are integrated within for example the roll-to-roll manufacturing system following the Ag deposition zone but prior to the subsequent dielectric film deposition zone, that is, the vacuum curtain wall separating the two deposition zones. Further, the laser system may deliver ultra-short pico- or femto-second laser pulses whereby the interaction between laser light field and the metallic layer (for example, Ag) results in the emission of an atomic/ionic plasma plume without any substantial heating of the underlying layer. These processes along with laser beam-delivery control systems, such as a computer controlled galvo-scanner, enables the creation of patterned silver, such as nanometre, micrometre or millimeter scale openings to effect specific electromagnetic transmission/reflection properties (such as, rendering transmission over a certain band of microwave frequencies), or creating specific radio frequency transceiver functionalities.

In some example embodiments described below, the fabrication process can be adapted such that the multilayer metallo-dielectric device exhibits one or more plasmonic absorption peaks (e.g. one or more peaks in its optical absorption spectrum). Such plasmonic absorption features may be employed, for example, to alter the optical properties of the metallo-dielectric multilayer device for purposes including, but not limited to, visible colour change and ultraviolet ray protection. Plasmonic features may be introduced by incorporating metallic nanostructures into the multilayer metallo-dielectric device. For example, plasmonic absorption can be introduced by generating nanoscale roughness (RMS roughness between 0.1 nm and 30 nm) in the metal film that leads to the generation of metallic nanostructures. Such roughness may be generated, for example, by (i) altering the roughness of the underlying dielectric layer, where the dielectric layer roughness can be varied by the sputter deposition rate and sputter gas chemistry; (ii) altering the growth characteristics of the metal film by varying the sputter deposition rate and sputter gas chemistry; (iii) atomic/ionic bombardment of the dielectric or, and metallic layer(s). In another example embodiment, metallic nanoparticles can be incorporated into the transparent dielectric layer, for example, by (i) varying the metallic film thickness; (ii) altering the dielectric chemistry, for example through hydrogenation, and thus promoting metal atom diffusion and agglomeration; (iii) nanoparticle deposition concurrent with the dielectric film deposition, for example, using a sputter-based process where metal atoms can agglomerate into nanoparticles prior to impinging the growth surface, or by spraying metal nanoparticles. In some example embodiments, the range of wavelengths and/or the strength of the plasmonic absorption can be controlled. For example, in example implementations in which one or more plasmonic features are provided via roughness of the metal film, the wavelength and/or strength of the plasmonic features may be varied by controlling the amount of roughness that is introduced. Alternatively, in example implementations in which one or more plasmonic features are provided via the incorporation of metallic nanoparticles into the transparent dielectric layer, the wavelength and/or strength of the plasmonic features may be varied by controlling the dispersion of the metallic nanoparticles.

The various example embodiments disclosed herein may be employed for a wide range of applications, and may be used, for example, as passive or active devices. For example, various metallo-dielectric structures disclosed here, and variations thereof, may be employed for applications such as, but not limited to, spectrally selective coatings which include transparent heat mirrors and transparent solar control coatings; spectrally selective resistive heaters which include transparent heat mirrors and transparent solar control coatings that concurrently provide active resistive heating; spectrally selective resistive heaters, which function as transparent heat mirrors and transparent solar control coatings, and are used as high efficiency defrosters and defoggers in automotive, aerospace, marine and allied applications; spectrally selective radiative cooling coatings; transparent conductors; near invisible radio transceivers and transmitters; and near invisible radio frequency energy harvesters.

The following paragraphs disclose a set of example embodiments of different structural configurations of a metallo-dielectric structure, involving different layer configurations and combinations that employ one or more hydrogenated metal nitride dielectric layers.

Figure 3:
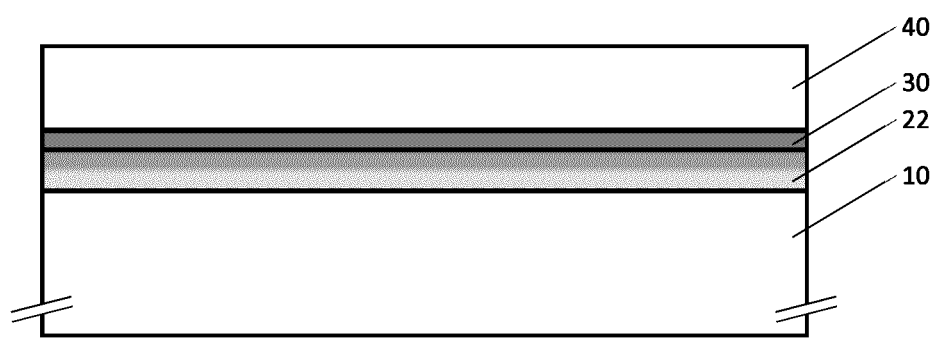
FIG. 3 illustrates an example embodiment of a metallo-dielectric multilayer coating on a substrate with an underlying hydrogenated metal nitride dielectric layer having a continuously or quasi-continuously graded hydrogen concentration.

Referring to FIG. 3, an alternative example embodiment of a metallo-dielectric stack is shown in which the underlying dielectric layer 22 is quasi-continuously or continuously graded in hydrogen concentration thereby locally enhancing the film properties in correspondence to interfacial requirements as well as bulk requirements. As shown in the figure, the concentration is graded in a direction parallel to a surface normal associated with the transparent substrate 10. Specifically, at the underlying dielectric film—substrate interface, the hydrogen concentration is selected for adhesion and permeation barrier, while at the underlying dielectric film—metallic film interface, the hydrogen concentration is selected for metallic film adhesion and smoothness and suitable electrical and optical properties.

Figure 4:
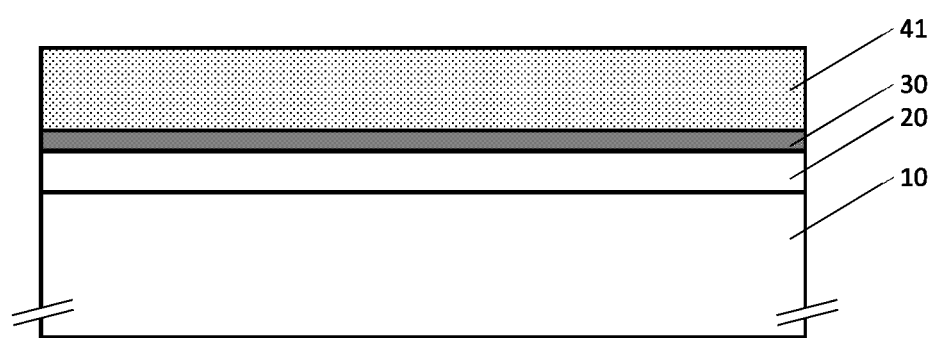
FIG. 4 illustrates an example embodiment of a metallo-dielectric multilayer coating on a substrate with an overlying hydrogenated metal nitride dielectric layer.

In another embodiment of a metallo-dielectric stack shown in FIG. 4, the underlying dielectric 20 is a metal nitride dielectric film, the overlying dielectric layer 41 is a hydrogenated metal nitride film, while the middle-lying layer 30 is a metallic film. Layer 41 is appropriately hydrogenated to support the formation of a hydroxide and oxide upon exposure to air in order to achieve a dense tight network that serves as an effective and robust barrier to permeation of oxygen and moisture. Further, the film may also be appropriately hydrogenated to enhance or, and modulate optical properties thereby rendering the desired optical performance including clear-neutrality and light-to-solar gain. The overlying dielectric film 41 also provides a dense tight hydrogenated network above the underlying metallic film.

Figure 5:
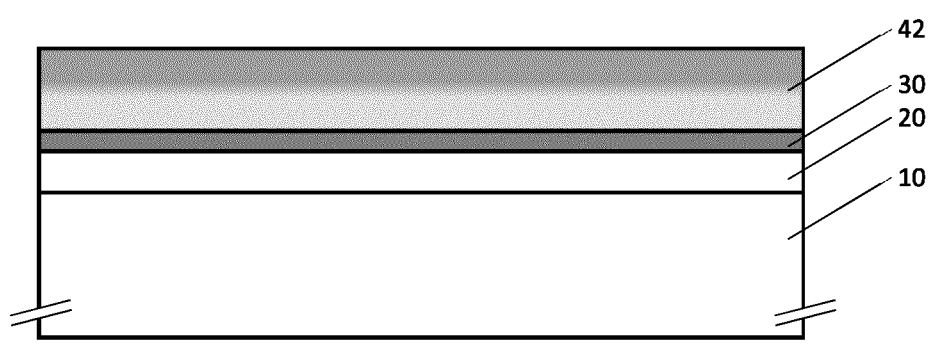
FIG. 5 illustrates an example embodiment of a metallo-dielectric multilayer coating on a substrate with an overlying hydrogenated metal nitride dielectric layer having a continuously or quasi-continuously varying hydrogen concentration.

In an alternative embodiment of a metallo-dielectric stack illustrated in FIG. 5, the overlying dielectric 42 is quasi-continuously or continuously graded in hydrogen concentration thereby locally enhancing the film properties in correspondence to suitable interfacial requirements as well as bulk requirements. Specifically, at the overlying dielectric film—metallic film interface, the hydrogen concentration is selected for adhesion of the overlying dielectric film to the metallic film, while at the overlying dielectric film—air interface, the hydrogen concentration is selected to promote a dense tight network and chemical composition for formation of robust native hydroxide and oxide barrier layers. The film may also be appropriately hydrogenated so as to enhance or, and modulate optical properties thereby rendering the desired optical performance including clear-neutrality and light-to-solar gain.

Figure 6:
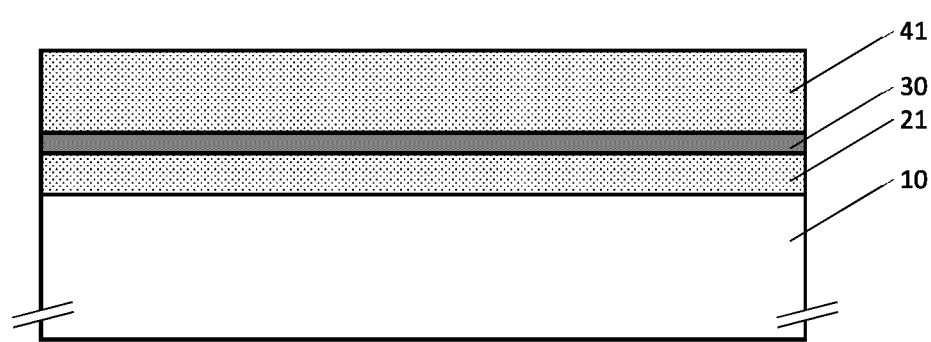
FIG. 6 illustrates an example embodiment of a metallo-dielectric multilayer coating on a substrate with hydrogenated metal nitride dielectric layers provided above and below the metal layer.

In another embodiment of a metallo-dielectric stack shown in FIG. 6, the underlying dielectric 21 and the overlying dielectric layer 41 are hydrogenated metal nitride dielectric films, while the middle-lying layer 30 is a metallic film. Layer 21 may be appropriately hydrogenated to support enhanced adhesion with the underlying substrate as well as to promote overtop non-islandic smooth Ag film growth. The underlying layer also provides a dense tight network with appropriate formation of hydroxide and oxide at the dielectric—substrate interface and thus serves as an effective and robust barrier to permeation of moisture and oxygen from the underlying substrate, especially in the case of permeable polymeric materials. Layer 41 may be appropriately hydrogenated to support the formation of a hydroxide and oxide upon exposure to air in order to achieve a dense tight network that serves as an effective and robust barrier to permeation of oxygen and moisture. Further, the film may also be appropriately hydrogenated to enhance or, and modulate optical properties thereby rendering the desired optical performance including clear-neutrality and light-to-solar gain. The film also provides a dense tight hydrogenated network abutting the underlying metallic film.

Figure 7:
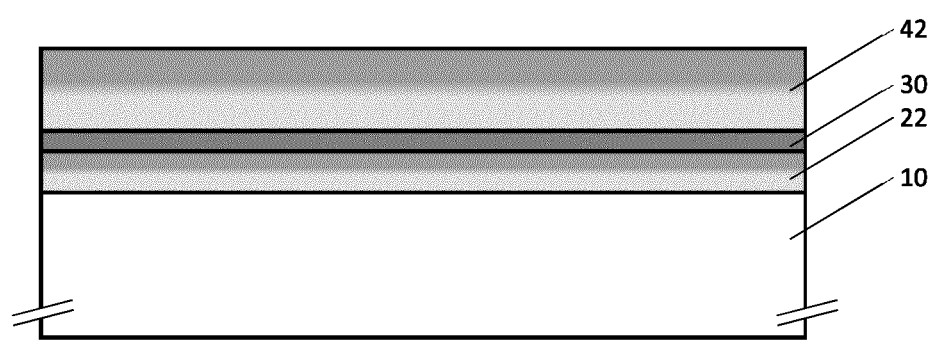
FIG. 7 illustrates an example embodiment of a metallo-dielectric multilayer coating on a substrate with hydrogenated metal nitride dielectric layers provided above and below the metal layer, and with each of the hydrogenated metal nitride dielectric layers provided above and below the metal layer having a continuously or quasi-continuously varying hydrogen concentration.

In an alternative embodiment of a metallo-dielectric stack illustrated in FIG. 7, the underlying dielectric 22 and overlying dielectric 42 are quasi-continuously or continuously graded in hydrogen concentration thereby locally enhancing the film properties in correspondence to interfacial requirements as well as bulk requirements. Specifically, at the overlying dielectric film—metallic film interface, the hydrogen concentration is selected for adhesion of the overlying dielectric film to the metallic film, while at the overlying dielectric film—air interface, the hydrogen concentration is selected to promote a dense tight network and chemical composition for formation of robust native hydroxide and oxide barrier layers. While at the underlying dielectric film—substrate interface, the hydrogen concentration is selected for adhesion and permeation barrier, while at the underlying dielectric film—metallic film interface, the hydrogen concentration is selected for metallic film adhesion and smoothness and suitable electrical and optical properties. Further, the two dielectric films may also be appropriately hydrogenated so as to enhance or, and modulate optical properties thereby rendering the desired optical performance including clear-neutrality and light-to-solar gain.

Figure 8:
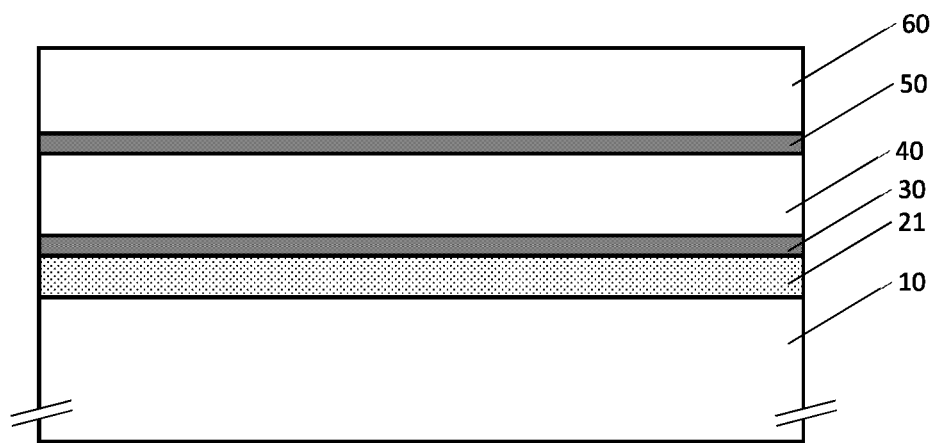
FIG. 8 illustrates an example embodiment of a metallo-dielectric multilayer coating on a substrate comprising two metallic layers and a first underlying hydrogenated metal nitride dielectric layer.

Another example embodiment of a metallo-dielectric multilayer stack is illustrated in FIG. 8 wherein 21 is the first underlying dielectric layer, 30 is the first metallic layer, 40 is the first overlying dielectric layer and second underlying layer, 50 is the second metallic layer, and 60 is the second overlying dielectric layer. The multilayer structure is provided on substrate 10. The first underlying dielectric layer 21 is a hydrogenated metal nitride, such as hydrogenated aluminum nitride or hydrogenated titanium nitride or hydrogenated titanium aluminum nitride, the dielectric layer 20 is a metal nitride dielectric layer, such as aluminum nitride or titanium nitride or titanium aluminum nitride, while the middle-lying metallic layer 30 is a metal film such as silver. The thicknesses of the dielectric layers 21, 40 and 60 and silver layers 30 and 50 are selected (appropriately tuned) to achieve the desired optical and electrical properties; in particular, optical properties such as, but not limited to, transmissivity in the visible, reflectivity in the near infrared, and emissivity in the mid-infrared, and electrical properties such as, but not limited to, electrical conductivity and sheet resistance.

Figure 9:
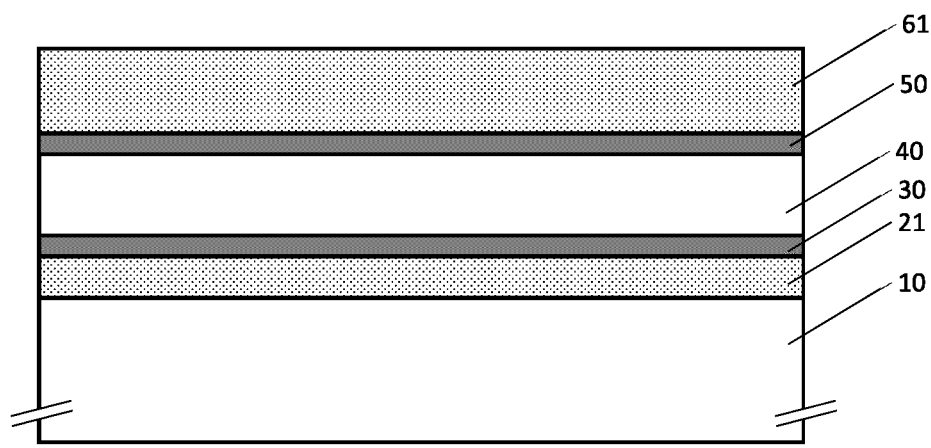
FIG. 9 illustrates an example embodiment of a metallo-dielectric multilayer coating on a substrate comprising two metallic layers, a first underlying hydrogenated metal nitride dielectric layer and a second overlying hydrogenated metal nitride dielectric layer.

In an alternative embodiment of a metallo-dielectric stack illustrated in FIG. 9, 21 is the first underlying dielectric layer, 30 is the first metallic layer, 40 is the first overlying dielectric layer and second underlying layer, 50 is the second metallic layer, and 61 is the second overlying dielectric layer. The multilayer structure is on substrate 10. The first underlying dielectric layer 21 and the second overlying dielectric layer 61 are hydrogenated.

Figure 10:
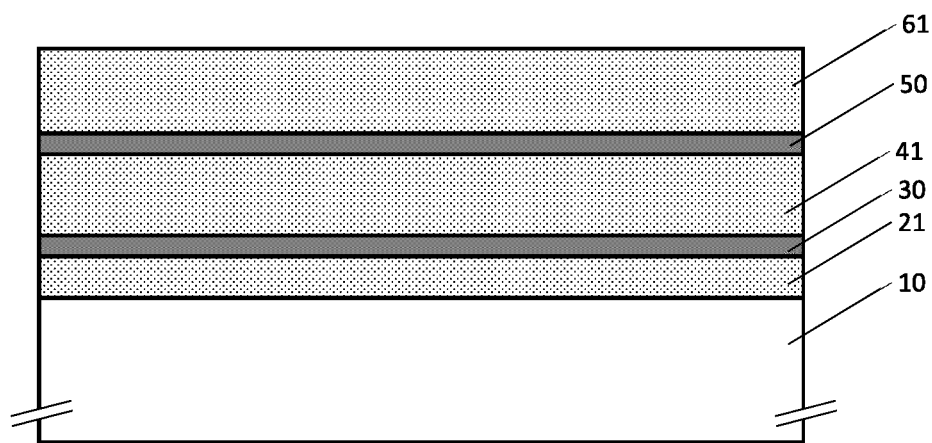
FIG. 10 illustrates an example embodiment of a metallo-dielectric multilayer coating on a substrate comprising two thin metallic layers and three hydrogenated metal nitride dielectric layers.

In another alternative embodiment of a metallo-dielectric stack illustrated in FIG. 10, 21 is the first underlying dielectric layer, 30 is the first metallic layer, 41 is the first overlying dielectric layer and second underlying layer, 50 is the second metallic layer, and 61 is the second overlying dielectric layer. The multilayer structure is provided on substrate 10. The first underlying dielectric layer 21, the first overlying dielectric layer and second underlying dielectric layer 41, and the second overlying dielectric layer 61 are hydrogenated.

Figure 11:
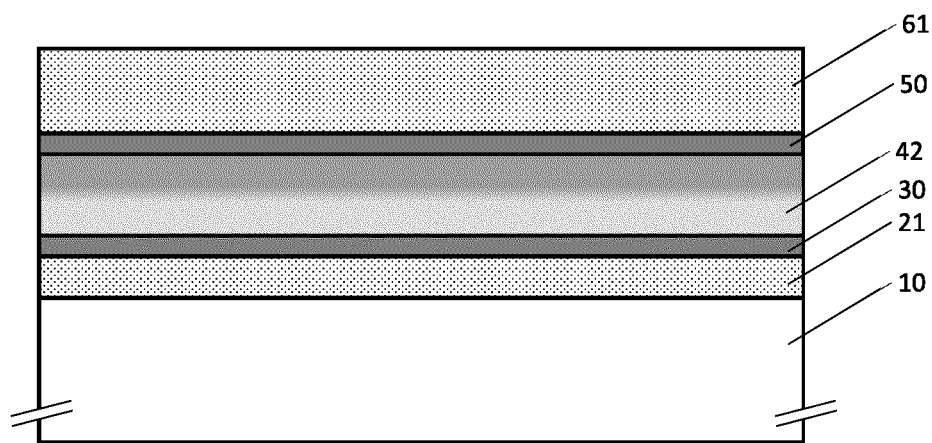
FIG. 11 illustrates an example embodiment of a metallo-dielectric multilayer coating on a substrate comprising two metallic layers and three hydrogenated metal nitride dielectric layers, where the middle hydrogenated metal nitride dielectric layer has a continuously or quasi-continuously varying hydrogen concentration.

In another alternative embodiment of a metallo-dielectric stack illustrated in FIG. 11, 21 is the first underlying dielectric layer, 30 is the first metallic layer, 42 is the first overlying dielectric layer and second underlying layer, 50 is the second metallic layer, and 61 is the second overlying dielectric layer. The multilayer structure is provided on substrate 10. The first underlying dielectric layer 21 and the second overlying dielectric layer 61 are hydrogenated, while the first overlying dielectric layer and second underlying dielectric layer 42 is quasi-continuously or continuously graded in hydrogen concentration thereby locally enhancing the film properties in correspondence to interfacial requirements as well as bulk requirements.

Figure 12:
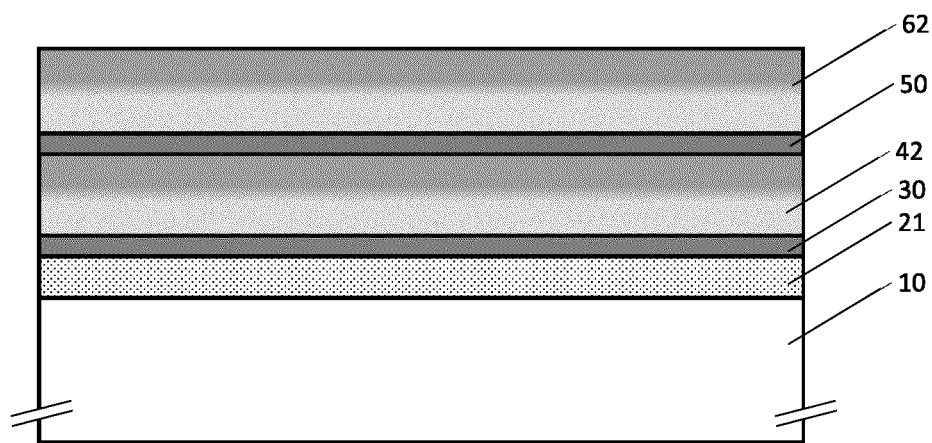
FIG. 12 illustrates an example embodiment of a metallo-dielectric multilayer coating on a substrate comprising two metallic layers and three hydrogenated metal nitride dielectric layers and where the top and middle hydrogenated metal nitride dielectric layers have continuously or quasi-continuously varying hydrogen concentration.

In another alternative embodiment of a metallo-dielectric stack illustrated in FIG. 12, 21 is the first underlying dielectric layer, 30 is the first metallic layer, 42 is the first overlying dielectric layer and second underlying layer, 50 is the second metallic layer, and 62 is the second overlying dielectric layer. The multilayer structure is provided on substrate 10. The first underlying dielectric layer 21 is hydrogenated, while the first overlying dielectric layer and second underlying dielectric layer 42 and the second overlying dielectric layer 62 are quasi-continuously or continuously graded in hydrogen concentration thereby locally enhancing the film properties in correspondence to interfacial requirements as well as bulk requirements.

Figure 13:
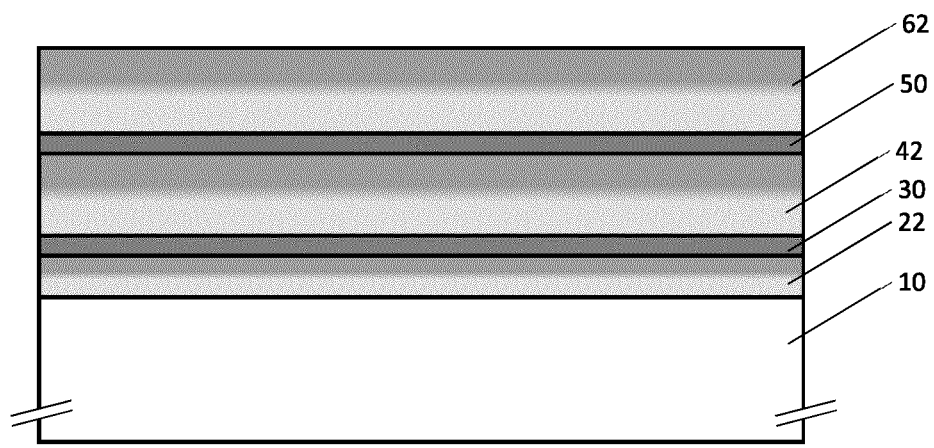
FIG. 13 illustrates an example embodiment of a metallo-dielectric multilayer coating on a substrate comprising two metallic layers and three hydrogenated metal nitride dielectric layers, where each hydrogenated metal nitride dielectric layer has continuously or quasi-continuously varying hydrogen concentration.

In another alternative embodiment of a metallo-dielectric stack illustrated in FIG. 13, 22 is the first underlying dielectric layer, 30 is the first metallic layer, 42 is the first overlying dielectric layer and second underlying layer, 50 is the second metallic layer, and 62 is the second overlying dielectric layer. The multilayer structure is provided on substrate 10. The first underlying dielectric layer 22, the first overlying dielectric layer and second underlying dielectric layer 42, and the second overlying dielectric layer 62 are quasi-continuously or continuously graded in hydrogen concentration thereby locally enhancing the film properties in correspondence to interfacial requirements as well as bulk requirements.

Figure 14:
FIG. 14 illustrates an example embodiment of a metallo-dielectric multilayer coating on a substrate comprising three metallic layers, a first underlying hydrogenated metal nitride dielectric layer, and a second overlying hydrogenated metal nitride dielectric layer.

Another example embodiment of a metallo-dielectric multilayer stack is illustrated in FIG. 14 wherein 21 is the first underlying dielectric layer, 30 is the first metallic layer, 40 is the first overlying dielectric layer and second underlying layer, 50 is the second metallic layer, 60 is the second overlying dielectric layer and third underlying dielectric layer, 70 is the third metallic layer, and 81 is the third overlying dielectric layer. The multilayer structure is provided on substrate 10. The first underlying dielectric layer 21 and third overlying dielectric layer 81 are hydrogenated metal nitride, such as hydrogenated aluminum nitride or hydrogenated titanium nitride or hydrogenated titanium aluminum nitride, while the dielectric layers 40 and 60 are a metal nitride, such as aluminum nitride or titanium nitride or titanium aluminum nitride, while the middle-lying metallic layers 30, 50 and 70 are a metal film such as silver. The thicknesses of the dielectric layers 21, 40, 60 and 81 and metal layers 30, 50 and 70 may be selected (appropriately tuned) to achieve the desired optical and electrical properties; in particular, optical properties such as, but not limited to, transmissivity in the visible, reflectivity in the near infrared, and emissivity in the mid-infrared, and electrical properties such as, but not limited to, electrical conductivity and sheet resistance.

Figure 15:
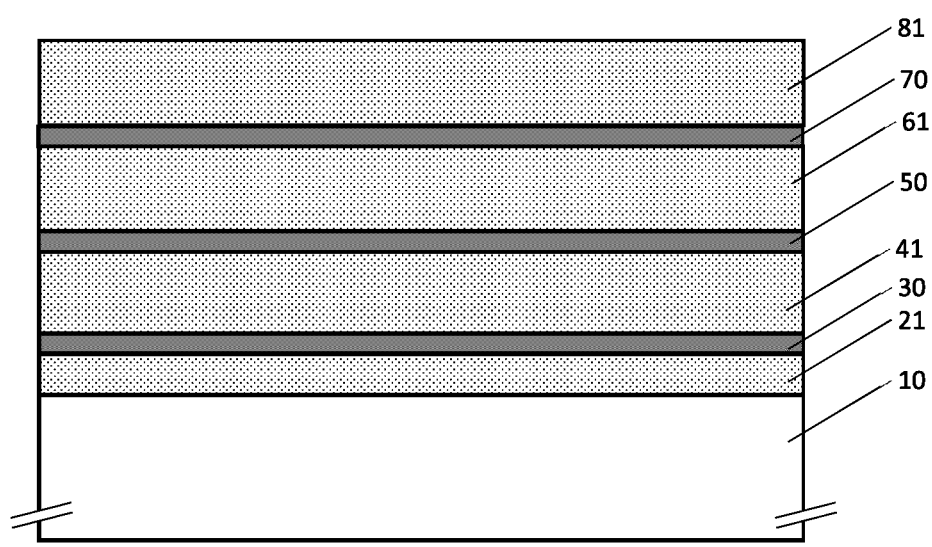
FIG. 15 illustrates an example embodiment of a metallo-dielectric multilayer coating on a substrate comprising three metallic layers, and four hydrogenated metal nitride dielectric layers.

In an alternative embodiment of a metallo-dielectric multilayer stack illustrated in FIG. 15, wherein 21 is the first underlying dielectric layer, 30 is the first metallic layer, 41 is the first overlying dielectric layer and second underlying layer, 50 is the second metallic layer, 61 is the second overlying dielectric layer and third underlying dielectric layer, 70 is the third metallic layer, and 81 is the third overlying dielectric layer. The multilayer structure is provided on substrate 10. The dielectric layers 21, 41, 61 and 81 are hydrogenated metal nitride, while the middle-lying metallic layers 30, 50 and 70 are a metal film such as silver. The thicknesses of the dielectric layers 21, 40, 60 and 81 and metal layers 30, 50 and 70 are appropriately tuned to achieve the desired optical and electrical properties; in particular, optical properties such as, but not limited to, transmissivity in the visible, reflectivity in the near infrared, and emissivity in the mid-infrared, and electrical properties such as, but not limited to, electrical conductivity and sheet resistance.

Figure 16:
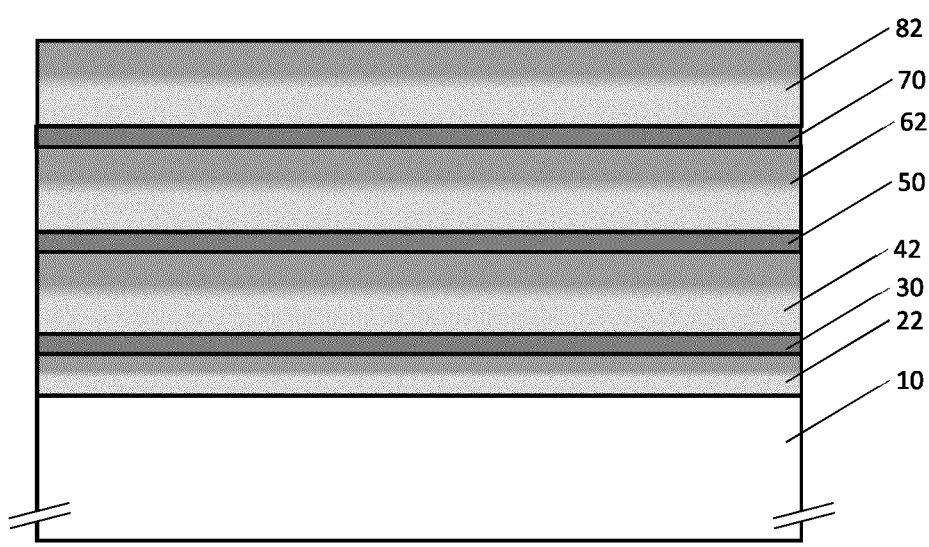
FIG. 16 illustrates an example embodiment of a metallo-dielectric multilayer coating on a substrate comprising three metallic layers and four hydrogenated metal nitride dielectric layers, where each hydrogenated metal nitride dielectric layer has continuously or quasi-continuously varying hydrogen concentration.

In another alternative embodiment of a metallo-dielectric multilayer stack illustrated in FIG. 16, wherein 22 is the first underlying dielectric layer, 30 is the first metallic layer, 42 is the first overlying dielectric layer and second underlying layer, 50 is the second metallic layer, 62 is the second overlying dielectric layer and third underlying dielectric layer, 70 is the third metallic layer, and 82 is the third overlying dielectric layer. The multilayer structure is on substrate 10. The dielectric layers 22, 42, 62 and 82 are quasi-continuously or continuously graded in hydrogen concentration thereby locally enhancing the film properties in correspondence to interfacial requirements as well as bulk requirements. The thicknesses of the dielectric layers 22, 42, 62 and 82 and metal layers 30, 50 and 70 may be selected (appropriately tuned) to achieve the desired optical and electrical properties; in particular, optical properties such as, but not limited to, transmissivity in the visible, reflectivity in the near infrared, and emissivity in the mid-infrared, and electrical properties such as, but not limited to, electrical conductivity and sheet resistance.

Figure 17A:
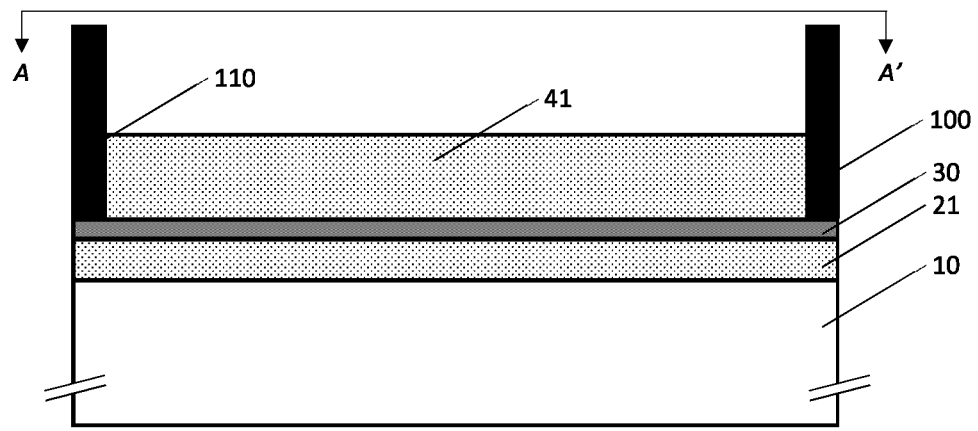
FIGS. 17A and 17B illustrate an example embodiment of a metallo-dielectric multilayer coating on a substrate wherein electrical busbar contacts are integrated on the metallic layer.
Figure 17B:
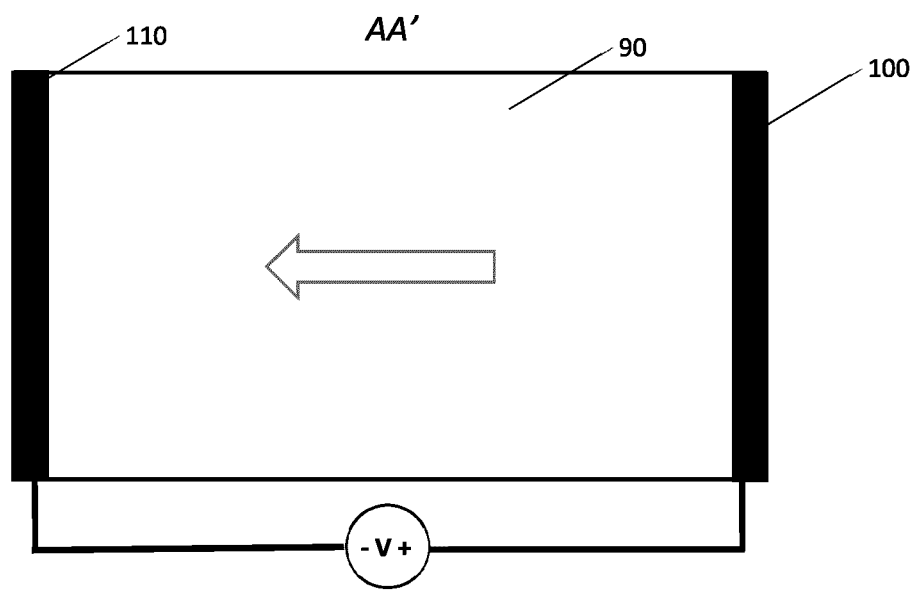

Another example embodiment of a metallo-dielectric multilayer stack is illustrated in FIGS. 17A and 17B, wherein the stack comprises underlying dielectric layer 21, metal layer 30, and dielectric layer 41. The multilayer structure is on substrate 10. Dielectric layers 21 and 41 are hydrogenated metal nitride, such AlN:H, and layer 30 is a metal such as silver. Electrical busbar contacts 100 and 110 make ohmic contacts with the metal layer 30, the busbars being situated spatially apart so as to facilitate the delivery of electrical power to the metallo-dielectric device 90 (plan view AA); the arrow pointing from the right to the left indicates the direction of electric current (i.e., the flow of positive charge). The electrical busbars 100 and 110 of appropriate thickness can be integrated in the metallo-dielectric device by depositing metallic contacts using a variety of methods including but not limited to electron beam evaporation of metals and metal alloys, sputter deposition of metals and metal alloys, and printing of metal inks and pastes with allied etching and firing processes.

Figure 17C:
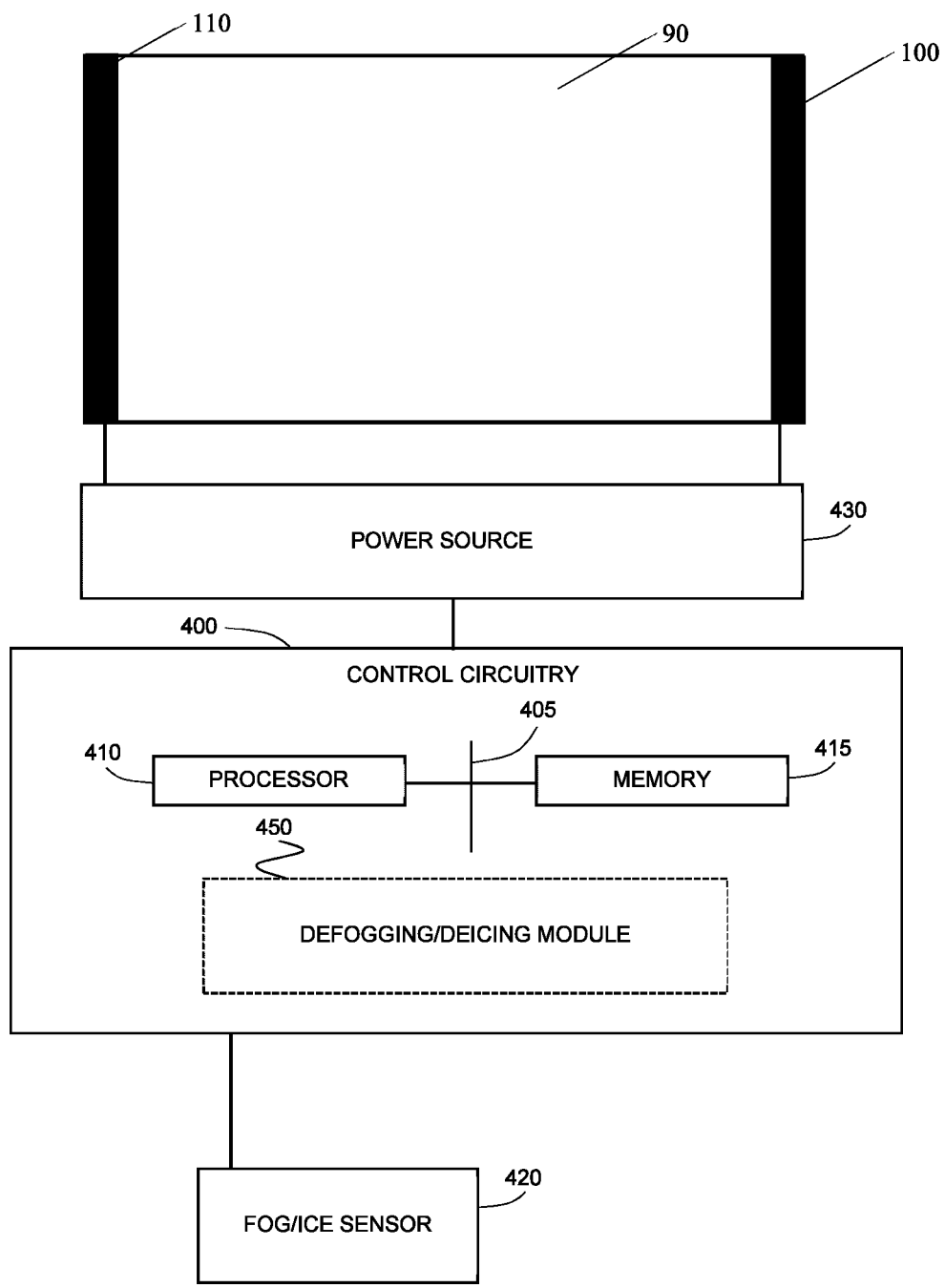
FIG. 17C illustrates an example defogging or de-icing system.

FIG. 17C illustrates and example defogging or de-icing system including a windshield with a solar control structure 90 having at least one hydrogenated metal nitride dielectric layer, as per the preceding embodiments, and electrical busbars 100, 110 in electrical communication with at least one metal layer formed within the structure. The system also includes a power source 430 and control circuitry 400 for controlling the current delivered to the solar control structure. The control circuitry 400 may be programmed with instructions, stored in the memory 415, and executable by the processor 410, to deliver time-dependent current to the solar control structure (as shown schematically by the defogging/deicing module 450). For example, the control circuitry may provide current continuously, or intermittently, and optionally according to a pre-determined temporal dependence, over a time duration suitable for defogging and/or de-icing. The control circuitry may further be connected to one or more sensors 420 for sensing the presence of ice or fog.

As shown in the example embodiment illustrated in FIG. 17C, the control circuitry 400 may include a processor 410, a memory 415, a system bus 405, and one or more optional additional devices.

It is to be understood that the example system shown in the figure is not intended to be limited to the components that may be employed in a given implementation. For example, the system may include one or more additional processors. Furthermore, one or more components of control and processing hardware 400 may be provided as an external component that is interfaced to a processing device.

Figure 18A:
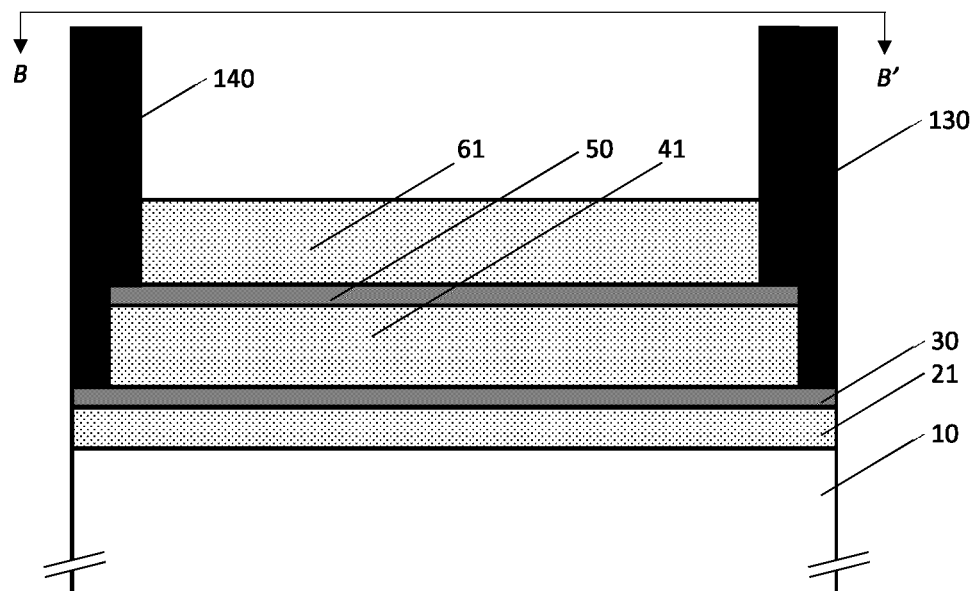
FIGS. 18A and 18B illustrate an example embodiment of a metallo-dielectric multilayer coating on a substrate comprising two metallic layers and wherein electrical busbar contacts are integrated on each of the metallic layers.
Figure 18B:
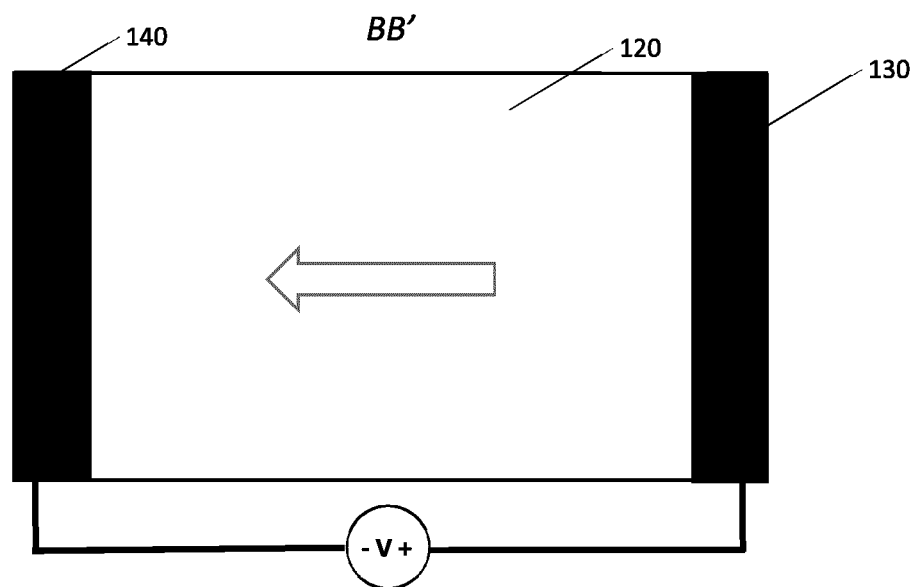

Another example embodiment of a metallo-dielectric multilayer stack is illustrated in FIGS. 18A and 18B, wherein the stack comprises dielectric layer 21, metal layer 30, dielectric layer 41, metal layer 50, and dielectric layer 61. The multilayer structure is on substrate 10. Dielectric layers 21, 41 and 61 are hydrogenated metal nitride, such AlN:H, and layers 30 and 50 are a metal such as silver. Electrical busbar contacts 130 and 140 make ohmic contacts with the metal layers 30 and 50, the busbars being situated spatially apart so as to facilitate the delivery of electrical power to the metallo-dielectric device 120 (plan view BB); the arrow pointing from the right to the left indicates the direction of electric current (i.e., the flow of positive charge). The electrical busbars 130 and 140 of appropriate thickness can be integrated in the metallo-dielectric device by depositing metallic contacts using a variety of methods including but not limited to electron beam evaporation of metals and metal alloys, sputter deposition of metals and metal alloys, and printing of metal inks and pastes with allied etching and firing processes.

An alternative embodiment would involve depositing, printing or affixing electrical bus bars directly on the dielectric; for example, on dielectric layer 40 in FIG. 1 or on dielectric layer 41 in FIG. 4. The metallic bus bar could be e-beam or sputter deposited directly on to the dielectric; the bus bar could be printed using a metallic ink (for example, a silver ink); or a metallic ribbon could be affixed with an appropriate conductive adhesive-epoxy. These contacts can also be appropriately heat treated—sintered to achieve a good ohmic contact. Alternatively, during ink printing the resistive nature of the dielectric can be mitigated through the use of a plasma discharge to locally strip off the dielectric. Further, laser processing can also be utilized; for example, laser ablation processes can be used to achieve selective peeling of the dielectric, and various methods of laser printing of metals, for example laser induced forward transfer, can be used.

Figure 31:
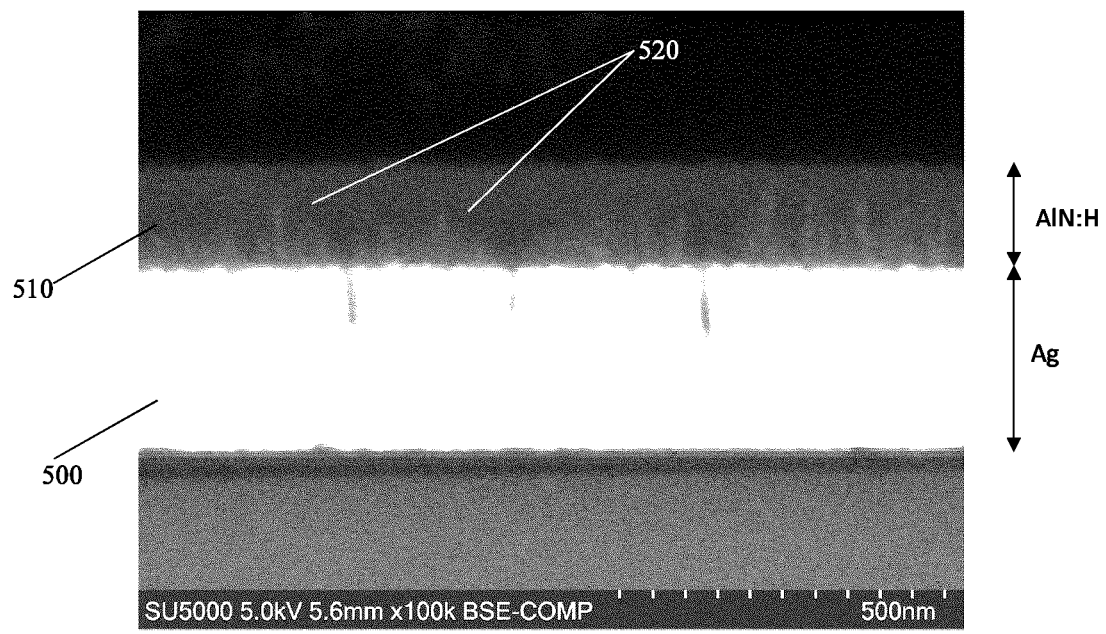
FIG. 31 shows the cross-sectional SEM image of an example metallo-dielectric coating.

In yet another embodiment silver migration into the dielectric, the Ag nanoparticles diffusing from the underlying Ag layer into the overlying dielectric, as illustrated in FIG. 31, could be utilized in conjunction with silver diffusion from the deposited/printed silver grid atop the dielectric, thereby resulting in a high quality ohmic contact. Local thermal/optical treatment(s) can be used concurrently to achieve optimal silver migration and thus low contact resistance.

In addition to the use of electrical bus bars, appropriate micro-nano thin electrical grids can also be utilized wherein the grids which are connected to the bus bars facilitate required power density while enabling lower voltage operation. The grids can be applied in a manner similar to the bus bars described in the preceding paragraph but being of dimensions undetectable by the human eye. For example, a plurality of micro-nano-metre thin electrical conducting wires could be utilized.

It will be understood that the preceding example embodiments are provided to illustrate a non-limiting set of example implementations and applications of multilayer metallo-dielectric structures having one or more hydrogenated metal nitride dielectric layers, and that a manifold of other potential embodiments are possible. For example, in some implementations, the spectrally selective metallo-dielectric multilayer stacks can be appropriately patterned thereby integrating other functionalities. For example, these could include appropriate aperture patterning (at the nano-, micro-, and milli-meter length scales) of the metallic layer there by rendering selective reflectivity and transmissivity properties in the RF frequency range wherein these patterns could be on a single or multiple metallic layers. Yet another example implementation involves the integration of RF electromagnetic radiation harvesting through the patterning of appropriate antennas and subsequent rectification which in turn could power appropriate sensor(s) thus resulting in a self-powered sensor(s). Various example embodiments, in addition to the functionalities mentioned, could lead to the formation of ultra-smart windows for a given enclosure/system.

Another example use of the preceding example embodiments involves the use of tunable hydrogenated metal nitrides, such as AlN:H, within the design of a spectrally selective radiative cooling coating device, where the visible and near-infrared portions of the electromagnetic spectrum are almost completely reflected while providing a transparent window in the mid-infrared, for example over the range of ~8-13 µm, thus permitting radiative thermal energy to be emitted from a given volume toward the cold outer space and hence effecting radiative cooling. As an example, a photonic-crystal cooling device could be constructed of various photonic-crystal layers wherein a broadband solar reflector comprising of bilayers of low and high index large bandgap materials on a silver substrate would utilize the hydrogenated nitrides.

EXAMPLES

The following examples are presented to enable those skilled in the art to understand and to practice embodiments of the present disclosure. They should not be considered as a limitation on the scope of the disclosure, but merely as being illustrative and representative thereof.

Figure 19:
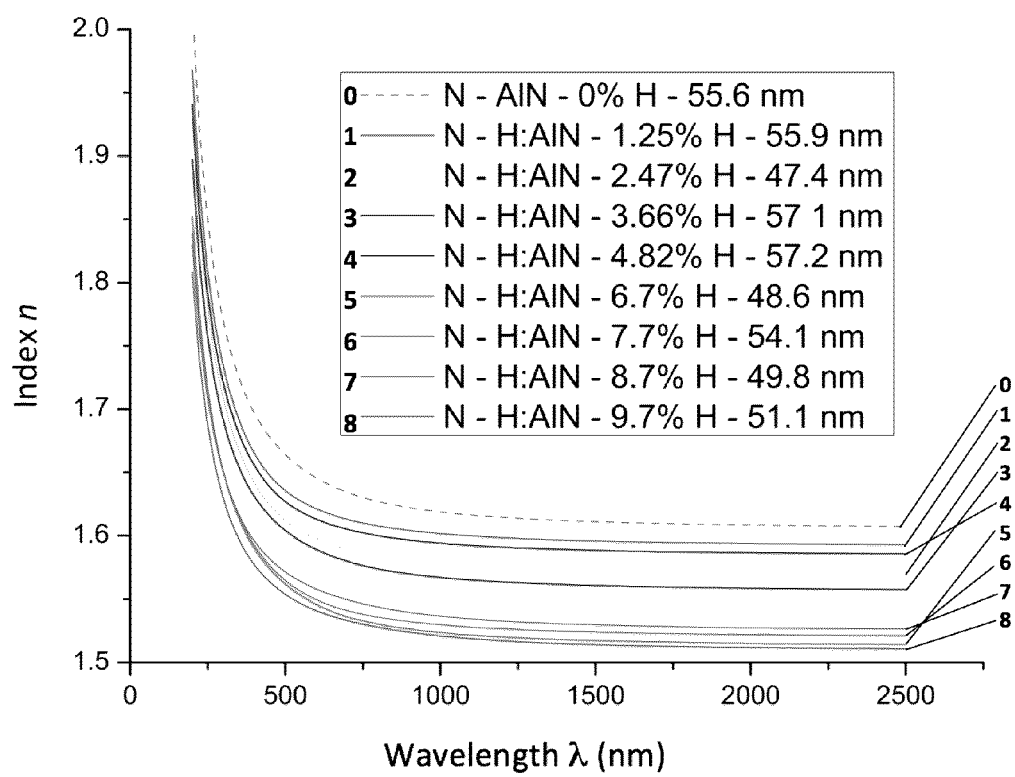
FIG. 19 plots the measured dependence of refractive index on wavelength for a set of AlN:H films prepared using a range of hydrogen concentrations ranging from approximately 0% to 10% volume fraction.

Example 1: Dependence of Refractive Index and Extinction Coefficient on Hydrogen Concentration for Hydrogenated AlN Films FIG. 19 shows an example data set for the optical index, as a function of wavelength, of AlN:H films deposited using RF reactive sputtering on glass substrate with hydrogen concentration ranging from approximately 0% to 10% volume fraction during sputtering. The principal sputter gases comprised of argon and nitrogen.

These films, deposited using reactive RF sputtering, were prepared in a cryogenically pumped multi-target sputtering chamber with nominal total gas flow rate of 20 sccm, wherein the argon flow rate is 15 sccm, nitrogen flow rate is 5 sccm, and the hydrogen flow rate is 0 to 10 sccm. Argon was introduced proximal to the aluminum target while nitrogen and hydrogen were introduced proximal to the growth surface. The chamber pressure during deposition is nominally 5 mTorr. The RF power ranges from 150 to 350 W. The substrate was initially at ambient temperature and was not actively heated or cooled.

Figure 20:
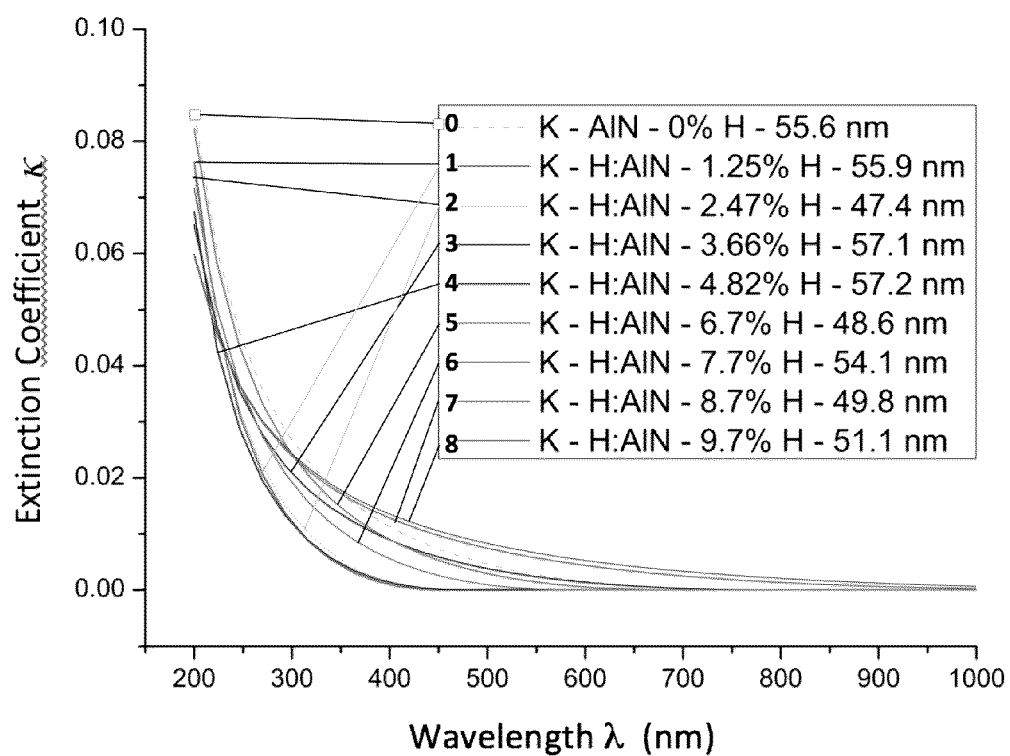
FIG. 20 plots the measured dependence of extinction coefficient on wavelength for a set of AlN:H films prepared using a range of hydrogen concentrations ranging from approximately 0% to 10% volume fraction.

FIG. 20 shows the corresponding data set for the extinction coefficient of AlN:H films. The variation in precursor hydrogen content evidently serves to modulate the optical index. Further, the introduction of hydrogen is observed to lead to a reduction in the extinction coefficient of the dielectric film over a range of optical wavelengths. The reduction in extinction coefficient is attributed to hydrogen bonding at atomic scale defect sites. The variation in optical index is a function of hydrogen bonding as well as modulation of the physical structure—grain size of the films.

Example 2: Morphology and Grain Size of Hydrogenated AlN Films

Figure 21:
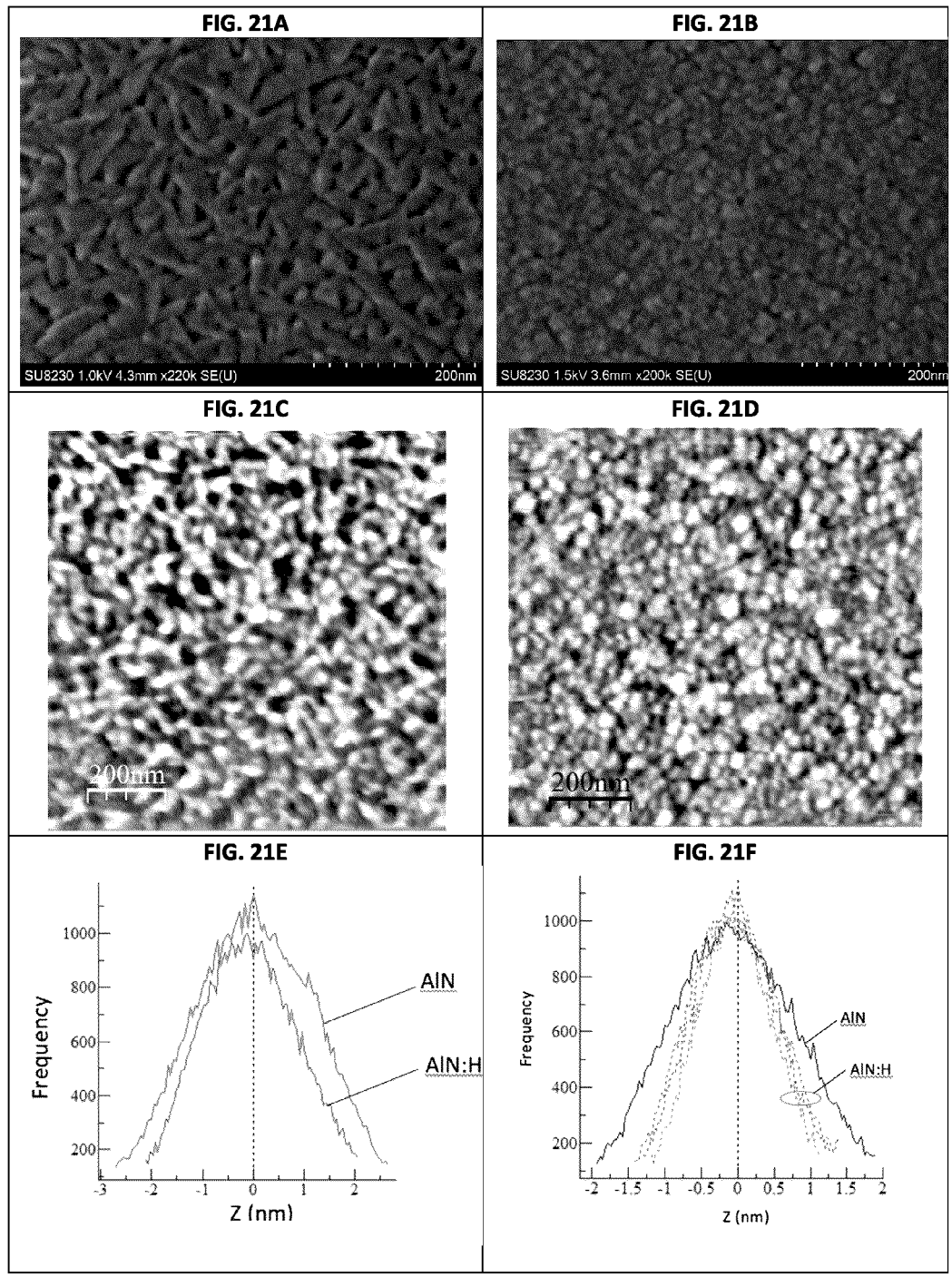
FIGS. 21A-F present scanning electron microscopy (SEM) images for AlN films prepared (A) without and (B) with hydrogenation; atomic force microscopy (AFM) viewgraphs for the AlN films prepared (C) without and (D) with hydrogenation, as well as a plot of the AFM distributions of surface protrusions in the z direction (i.e. the vertical direction) of the example films (E and F).

FIG. 21 (A-F) show scanning electron microscopy (SEM) and atomic force microscopy (AFM) viewgraphs of example AlN and AlN:H films deposited on glass, and their distributions of surface feature/grain protrusion/height in the Z (vertical) direction. Hydrogenation of aluminum nitride evidently reduces the grain size (see FIGS. 21A and 21B showing SEM viewgraphs of AlN and AlN:H films, respectively) and yields a smoother film. The average grain size and standard deviation for the AlN film is 48.6±9 nm and for the AlN:H film is 25.4±9 nm. The surface roughness of the films is observed in the AFM scans (see FIGS. 21C and 21D showing AFM scans of AlN and AlN:H film surfaces, respectively). Further, the distributions of surface feature/grain protrusion/height in the Z direction are shown in FIG. 21E and FIG. 21F; in FIG. 21E the AlN:H film has a narrower distribution with a full-width at half-maximum (FWHM) of approximately 2.2 nm while the AlN film has a FWHM of approximately 3.6 nm; in FIG. 21F distributions for another example of AlN and a set of AlN:H films show FWHM of approximately 2.5 nm and approximately 1.4 nm, respectively.

Figure 22:
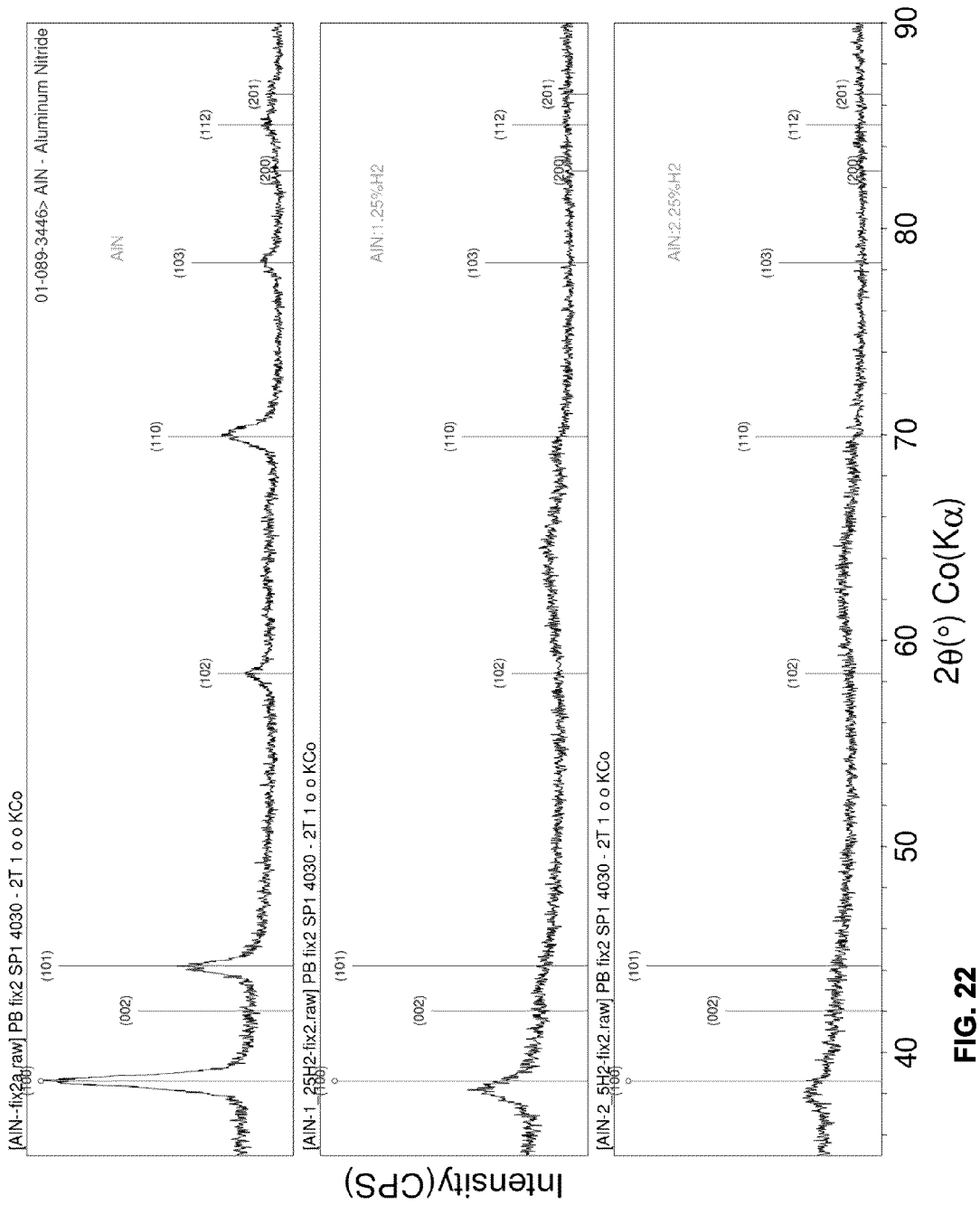
FIG. 22 shows the grazing angle x-ray diffraction profiles of example AlN and AlN:H films.

Example 3: Small Angle X-Ray Diffraction (XRD) Studies of Hydrogenated AlN Films FIG. 22 shows three small angle x-ray diffraction (XRD) patterns, one for AlN and two for AlN:H films, deposited using RF reactive sputtering on Si (100), where the latter were grown with 1.25% and 2.5% volume fraction hydrogen in the precursor gas flow. The top most XRD scan shows the diffraction pattern for AlN while the second and third XRD scans show the diffraction patterns for AlN:H grown using 1.25% and 2.5% hydrogen, respectively. It is observed that the characteristic crystalline peak/line intensities are reduced with increasing hydrogen and the film progressively assumes an increasing amorphous character.

Example 4: Hydrogenation During Film Deposition and Post-Deposition

Figure 23:
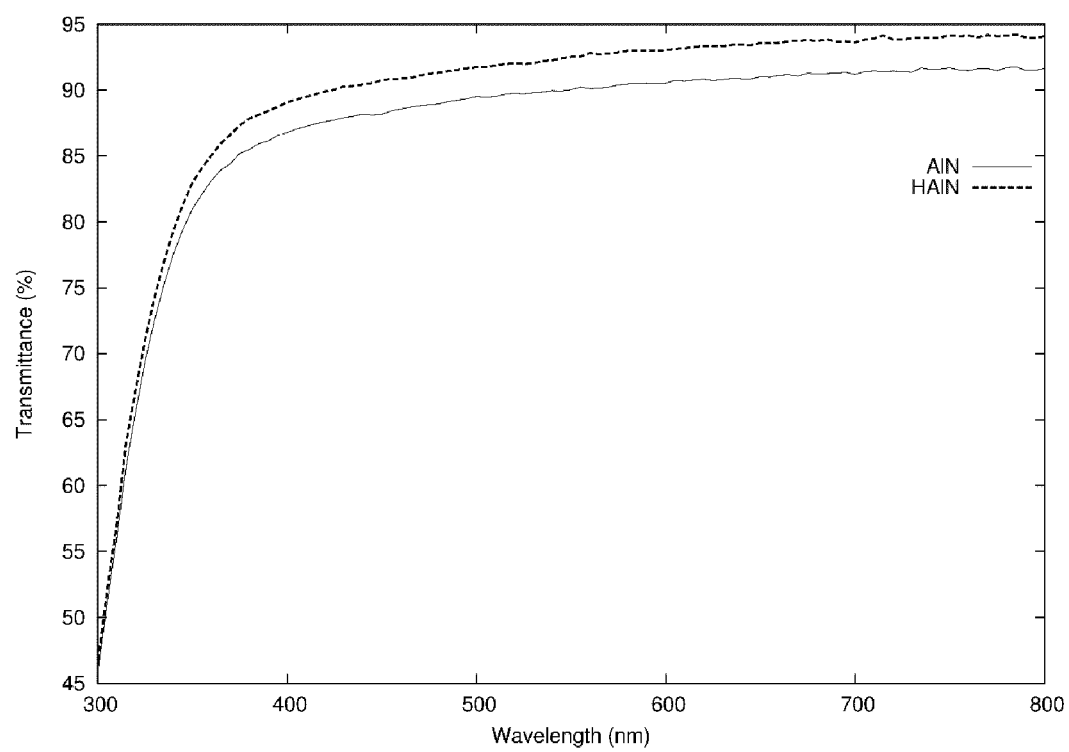
FIG. 23 plots the transmittance of an example AlN film prior to and post hydrogenation.

FIG. 23 illustrates that the optical transmission of AlN can be equivalently enhanced by post-deposition hydrogenation. Specifically, an example AlN film deposited on glass is exposed to an RF hydrogen plasma. The optical transmission of the AlN film prior to hydrogenation and post hydrogenation (denoted HAlN) show that optical transmittance of the film is improved over a range of optical wavelengths.

Figure 24:
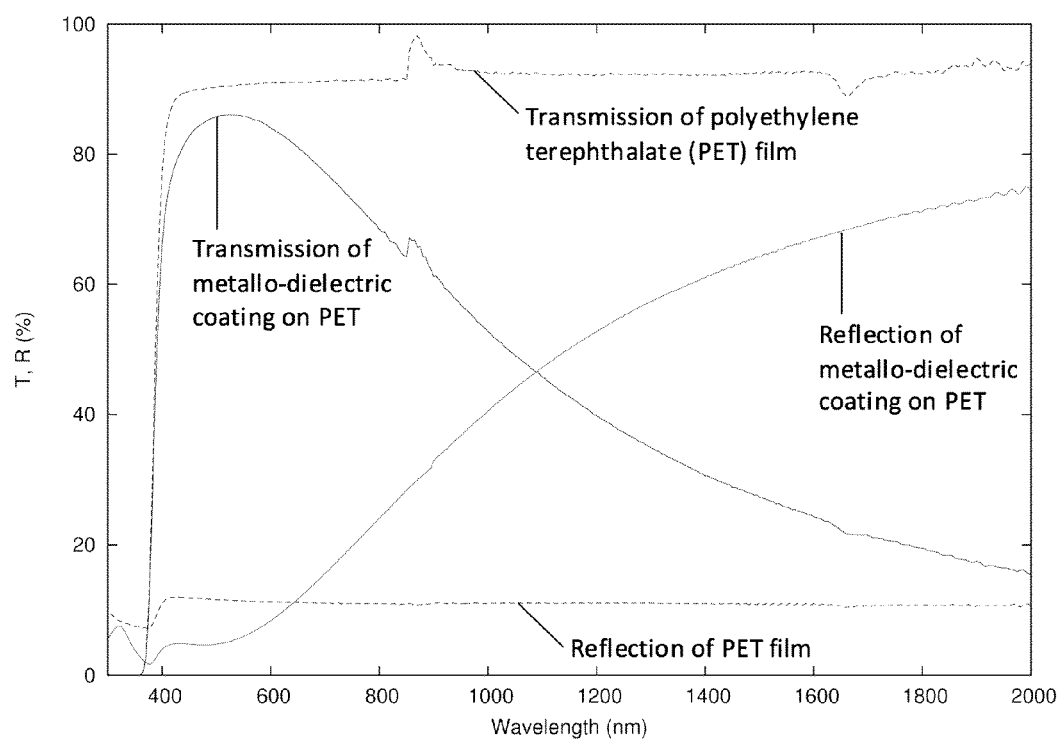
FIG. 24 plots the optical transmittance and reflectance profiles for an example metallo-dielectric coating on polyethylene terephthalate (PET) film of 50 μm thickness, as well as profiles for the uncoated PET film.

Example 5: Measured Optical Properties of Metallo-Dielectric Stacks with and without Hydrogenation The optical properties of an example metallo-dielectric multilayer stack, comprising an underlying dielectric layer, a middle-lying metal layer, and an overlying dielectric layer, are shown in FIG. 24. The metallo-dielectric stack is deposited using sputter deposition. The dielectric layers are hydrogenated aluminum nitride and the metal layer is silver. The substrate is a polyethylene terephthalate (PET) film. The transmission and reflection curves for the bare PET film and the coated PET film are shown in the figure. The peak transmittance in the visible is 86%, the photopic weighted visible transmittance is 85%, and the total solar energy rejection is 35%. The discontinuity in the transmittance curves near ~900 nm is a detector shift.

Figure 25:
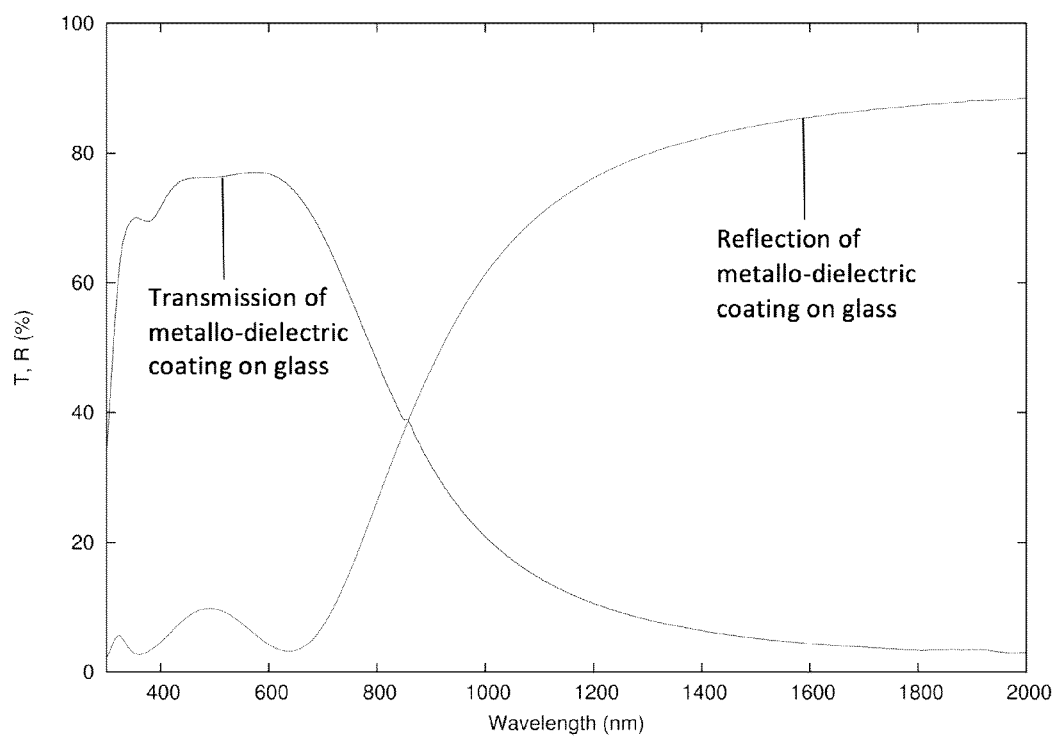
FIG. 25 plots the optical transmittance and reflectance profiles for an example metallo-dielectric coating on glass of 1.1 mm thickness.

The optical properties of another example metallo-dielectric multilayer stack, comprising a first underlying dielectric layer, a first metal layer, a first overlying and second underlying dielectric layer, a second metal layer, and second overlying dielectric layer, are shown in FIG. 25. The metallo-dielectric stack is deposited using sputter deposition. The dielectric layers are hydrogenated aluminum nitride and the metal layers are silver. The substrate is glass. The transmission and reflection curves for the coated glass are shown in the figure. The peak transmittance in the visible is 77%, the photopic weighted visible transmittance is 76%, and the total solar energy rejection is 47%. The colour parameters for the coated glass are $L^*=90.10$, $a^*=-0.55$, and $b^*=0.63$. Discontinuity in the transmittance curves near ~900 nm is a detector shift.

Figure 26:
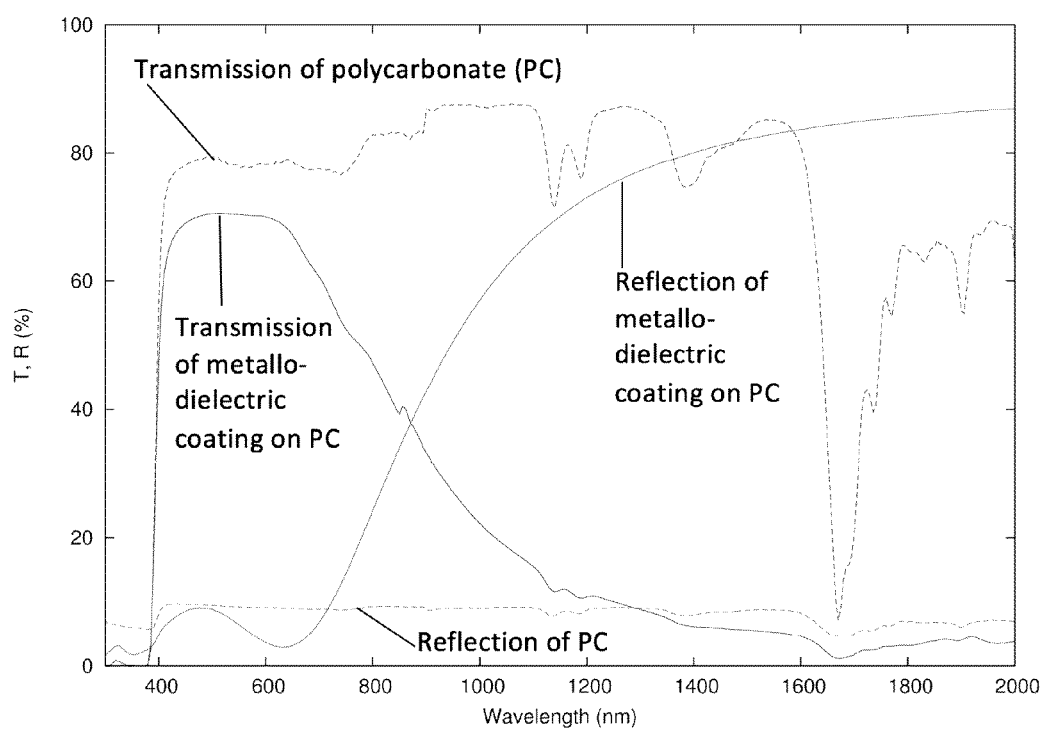
FIG. 26 plots the optical transmittance and reflectance profiles for an example metallo-dielectric coating on polycarbonate sheet of 3 mm thickness, as well as profiles for the uncoated polycarbonate sheet.

The optical properties of another example metallo-dielectric multilayer stack, comprising a first underlying dielectric layer, a first metal layer, a first overlying and second underlying dielectric layer, a second metal layer, and second overlying dielectric layer, are shown in FIG. 26. The metallo-dielectric stack is deposited using sputter deposition. The dielectric layers are hydrogenated aluminum nitride and the metal layers are silver. The substrate is polycarbonate sheet. The transmission and reflection curves for the polycarbonate sheet are shown in the figure. The peak transmittance in the visible is 71%, the photopic weighted visible transmittance is 70%, and the total solar energy rejection is 49%. The colour parameters for the coated polycarbonate are $L^*=87.04$, $a^*=-1.48$, and $b^*=1.42$; the colour parameters for the uncoated polycarbonate are $L^*=90.9$, $a^*=-0.52$, $b^*=0.50$.

Figure 27:
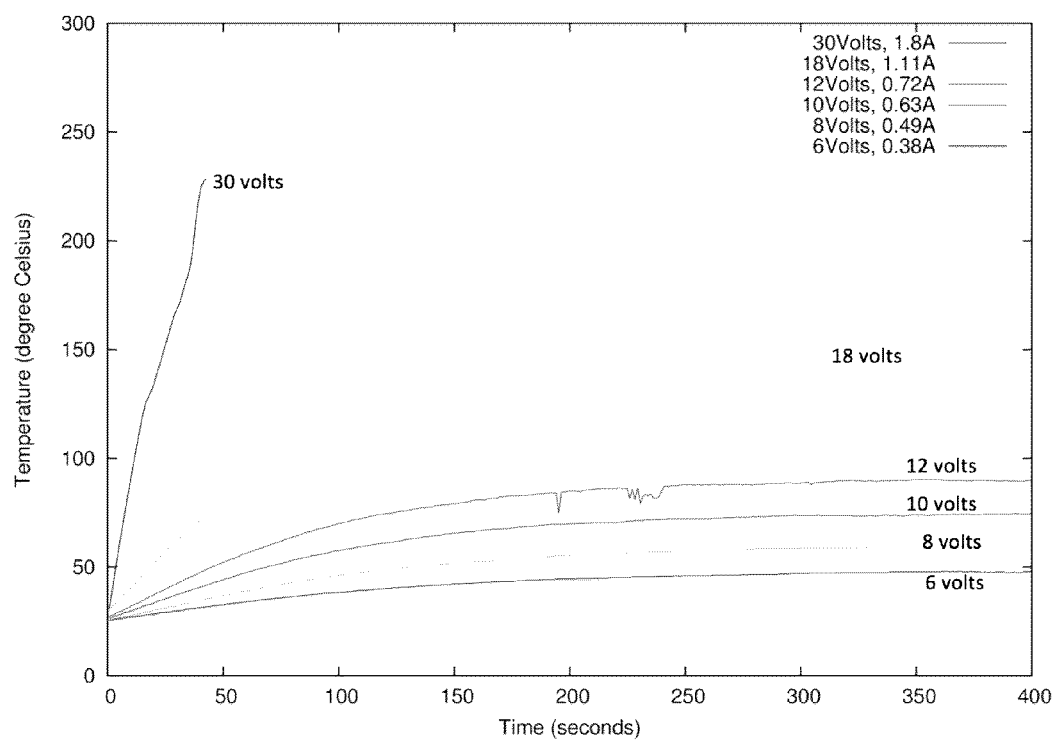
FIG. 27 plots the temperature-time profiles for an example metallo-dielectric coating on glass subjected to different voltage (and hence power) levels.
Figure 29A:
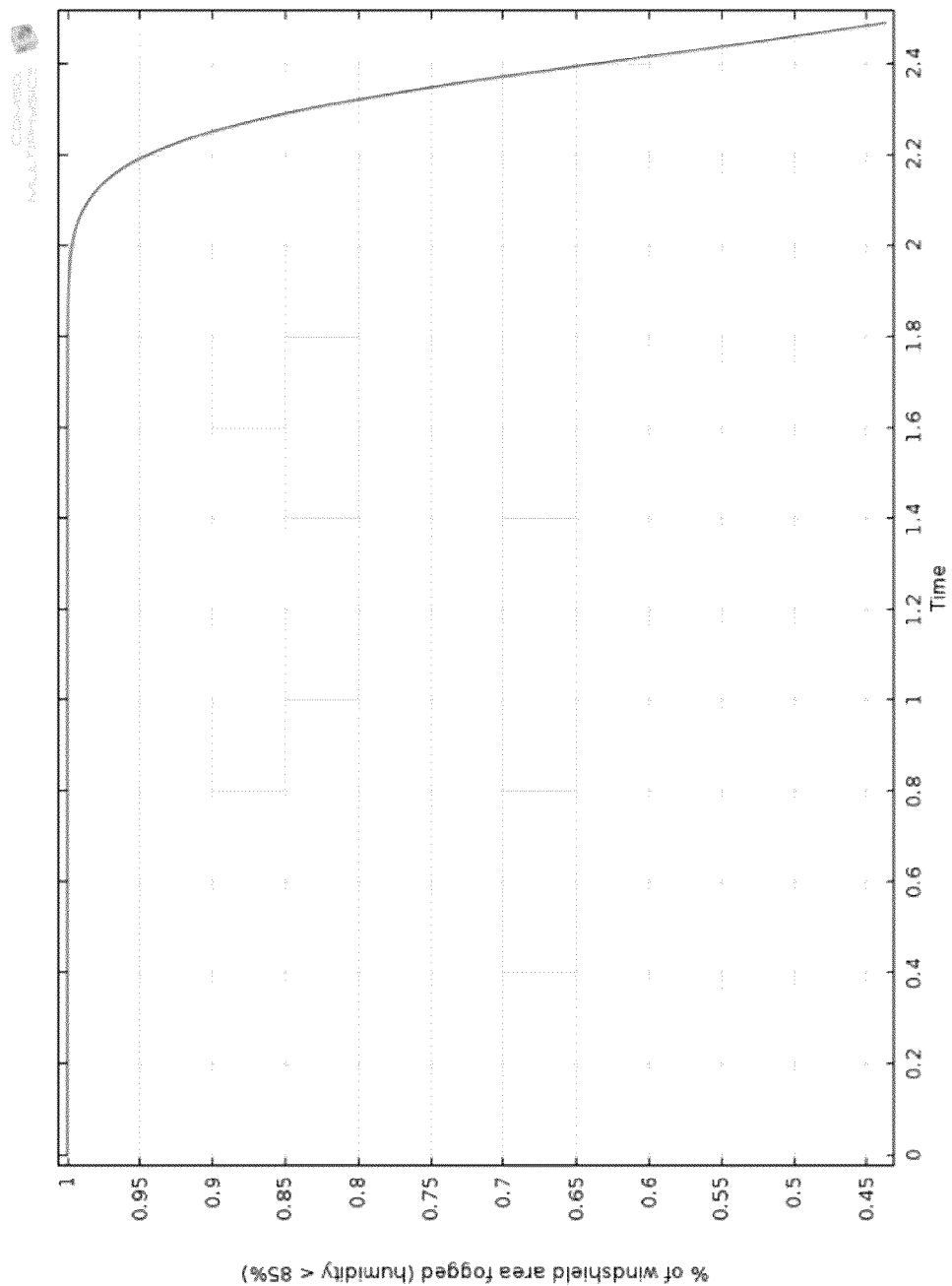
FIGS. 29A-D illustrate the simulated defogging performance of an example metallo-dielectric coating on glass, where FIG. 29A plots the time dependence of the fogged area when current is applied to the stack
Figure 29B:
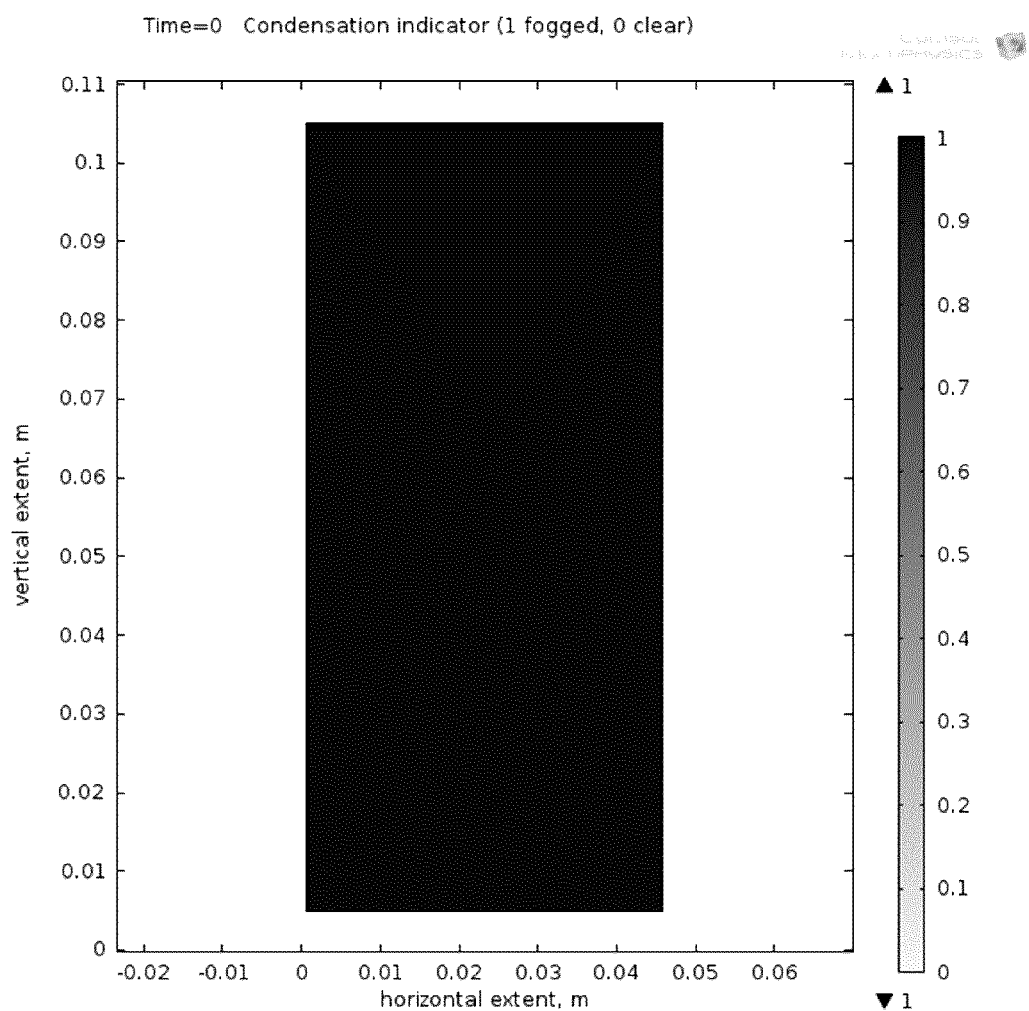
Figure 29C:
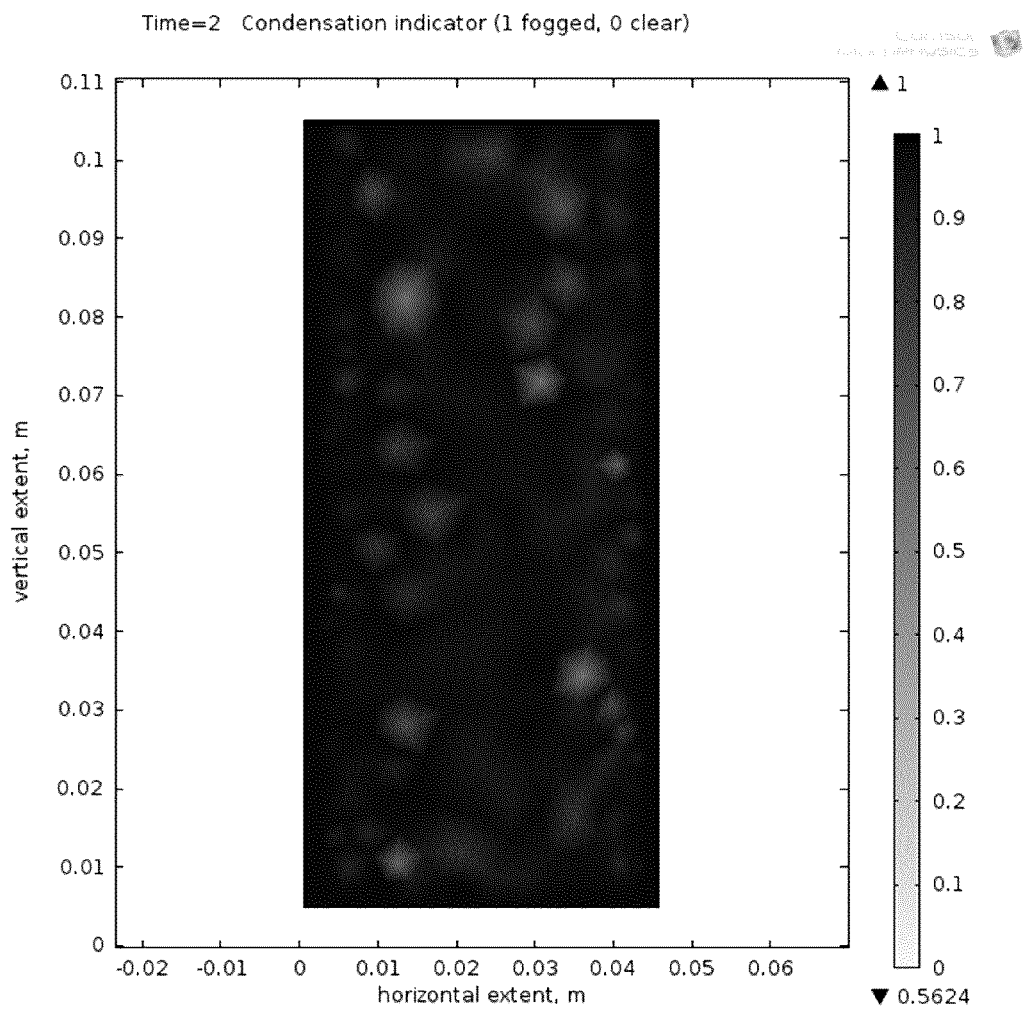
Figure 29D:
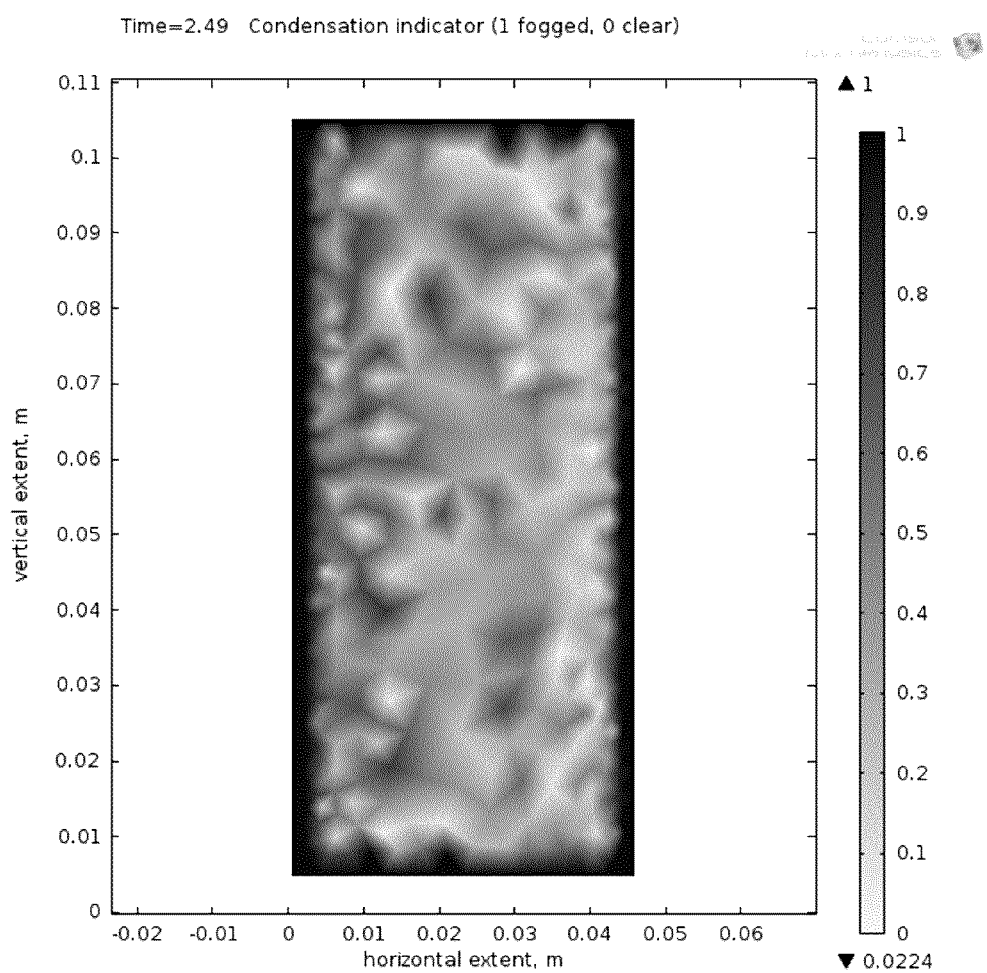
Figure 30A:
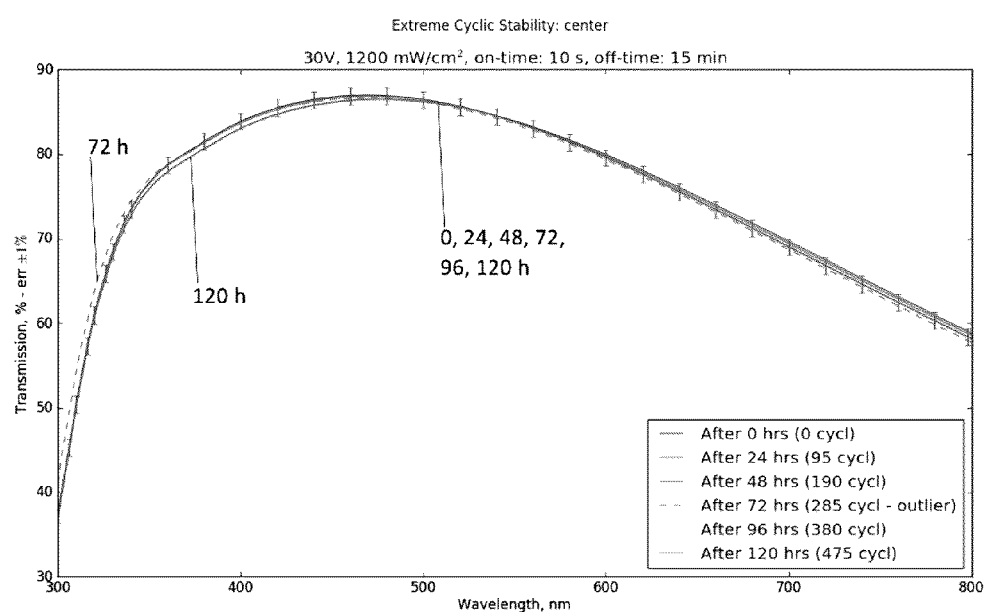
FIGS. 30A-D show the optical transmittance curves (A-C) on an example metallo-dielectric, measured at several points (D), measured at different times following a series of thermal heating and cooling cycles.
Figure 30B:
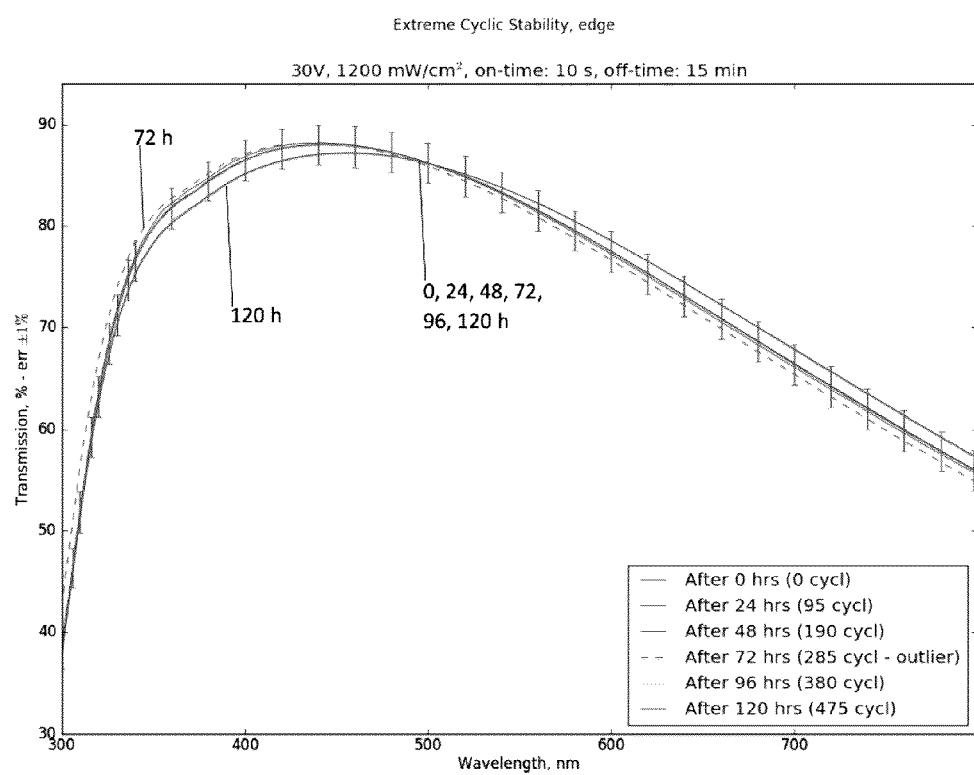
Figure 30C:
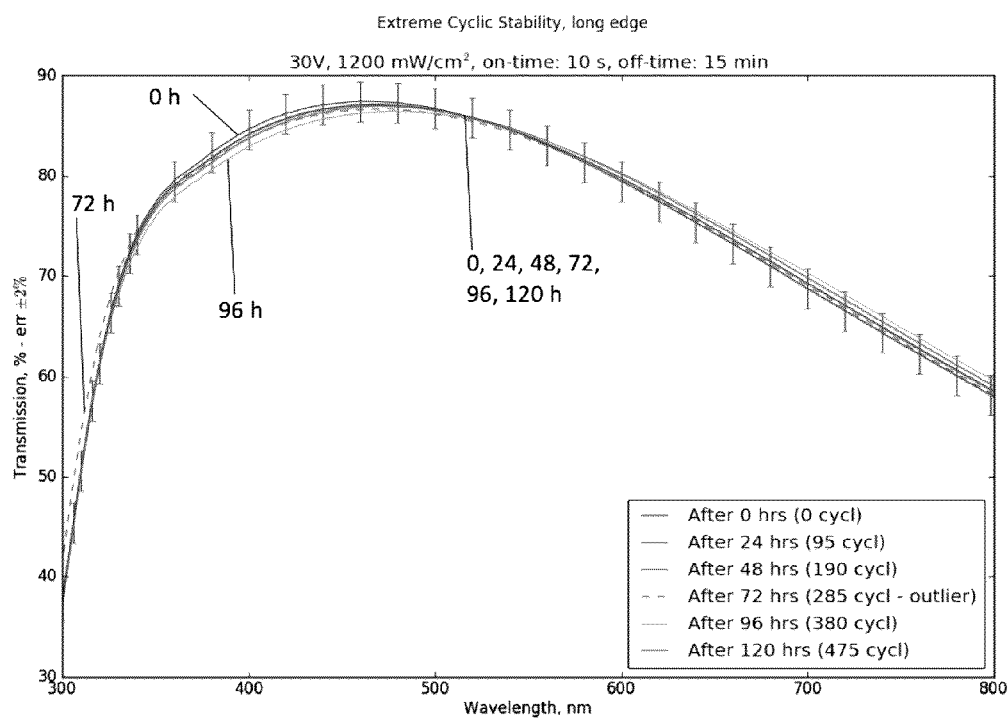
Figure 30D:
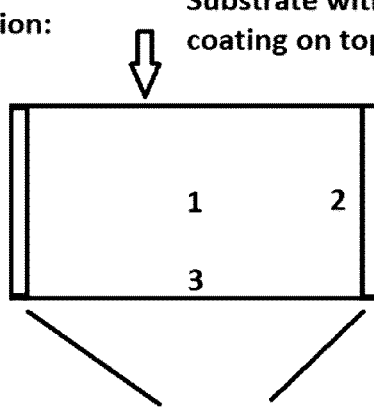

Example 6: Experimental Studies of Performance of Metallo-Dielectric Devices with Hydrogenated AlN Layers for De-Icing and Defogging Applications The heating performance of an example metallo-dielectric multilayer stack is illustrated in FIG. 27. The multilayer stack is deposited on a glass substrate. Electrical busbars in contact with the metallic layer are connected to a variable power source. Profiles of the temperature evolution as a function of time are shown for various power levels. Temperature is measured on the opposite glass surface.

The defrosting performance of an example metallo-dielectric multilayer stack is illustrated in FIG. 28 (A, B). The multilayer stack is deposited on a glass substrate wherein the electrical busbars in contact with the metallic layer in the stack are connected to a variable power source. A sheet of ice, approximate thickness of 1 mm, is frozen directly onto the uncoated side of the glass substrate. While under a prevailing ambient temperature of approximately −10° C., the stack is electrically powered and the time required to eliminate the ice from the glass surface is noted for a variety of power levels. Upon sufficient uniform power delivery to the glass—ice interface, a thin melted layer of water develops at the interface (i.e., the entire surface of the interface) and leads to sliding of the sheet of ice. The 'time to slide' is defined as the duration of time between power-on and eventual sliding of the sheet of ice. FIG. 28 A shows the time to slide as a function of the electrical power density. Direct and uniform application of high power density over the entire ice covered area results in swift freeing of the sample surface from ice, without requiring full melting of the ice and without losing heat to the surroundings—as deicing is very rapid. This leads to significant energy savings. FIG. 28 B illustrates the existence of the minimum energy required to free surface of ice. The figure also includes voltages and currents required for equivalent defrosting in a full scale standard vehicle windshield of approximately 0.7 m×1.4 m.

The projected defogging performance of an example metallo-dielectric coating is shown in FIG. 29 (A-D). The device structure is similar to that described above. Using a benchmarked, fully convective COMSOL Multiphysics model, the fraction of the example coated glass surface covered with fog as a function of time is shown in FIG. 29 A. Electrical power to the coating is turned on at time zero. FIGS. 29 B-D present 2-dimensional maps of the defogging pattern at different times (time 0, 2 seconds, and 2.5 seconds, respectively).

Example 7: Thermal Stability of Metallo-Dielectric Devices with Hydrogenated AlN Layers The stability of example metallo-dielectric multilayer stacks is illustrated in FIG. 30 (A-D). The metallo-dielectric stack is on glass. Temperature is measured on the opposite glass surface. Optical transmission is measured at three different locations (as shown in the sketch FIG. 30 D) at different times; initially at time zero and subsequently at different times following a series of thermal heating and cooling cycles. Each thermal cycle comprised of turning on the electrical power for 10 seconds followed by a 15 minute power-off cool-down period. Typical initial temperature is room temperature while the peak temperature following the heating portion of the thermal cycle is approximately 100° C.

Example 8: Plasmonic Absorption of Metallo-Dielectric Devices with Hydrogenated AlN Layers A cross-sectional SEM image of an example metallo-dielectric multilayer stack is illustrated in FIG. 31. The image, in back-scatter mode, illustrates the presence of silver (500), seen as white particles (520), in the top hydrogenated AlN layer (510), seen as a dark grey layer. The silver nanoparticles give rise to localized surface plasmon resonance.

Figure 32:
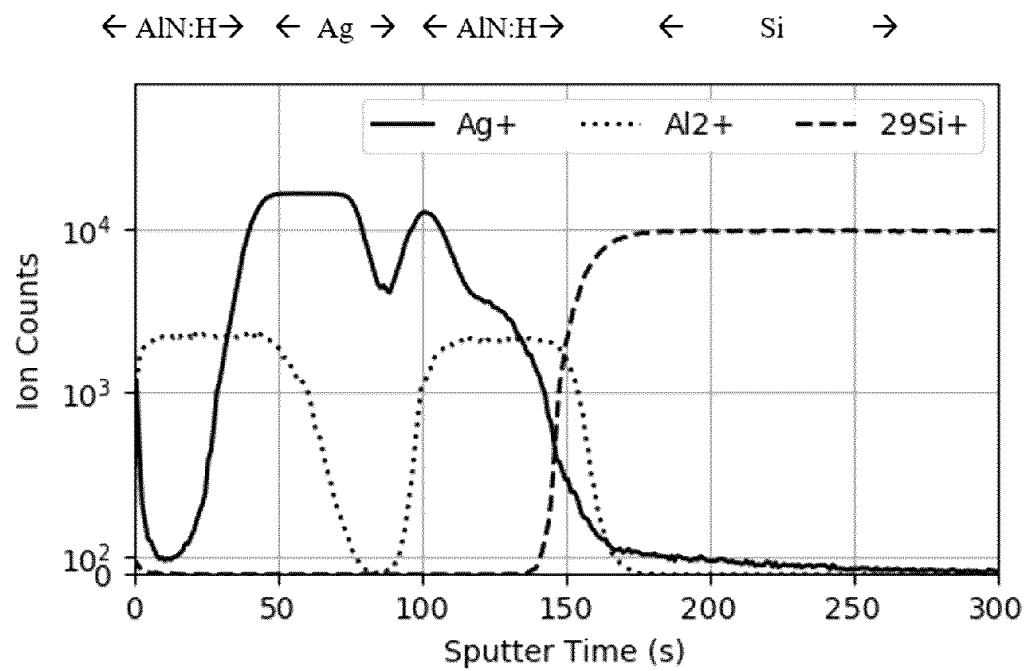
FIG. 32 shows the depth profile from ToF-SIMS of an example metallo-dielectric coating.

A depth profile obtained via Time of Flight Secondary Ion Mass Spectrometry (ToF-SIMS) of an example metallo-dielectric multilayer stack is plotted in FIG. 32. The sputter time on the horizontal axis is a proxy for the distance from the stack surface. Labels at the top identify the different regions of the plot as the top hydrogenated AlN layer, the middle silver layer, the bottom hydrogenated AlN layer, and the silicon substrate. The plot shows the presence of silver inside the top hydrogenated AlN layer, corroborating the observations in the SEM image shown in FIG. 31.

Figure 33:
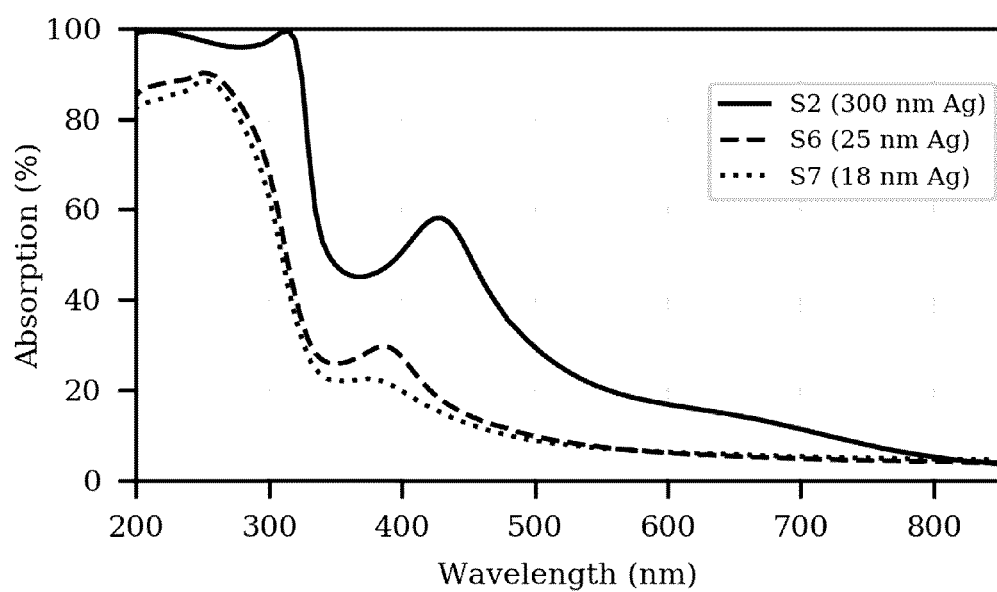
FIG. 33 shows the optical absorption curves of 3 example metallo-dielectric coating with different silver layer thicknesses.

Plasmonic absorption of example metallo-dielectric multilayer stacks is illustrated in FIG. 33. The metallo-dielectric coatings with varying silver layer thicknesses are deposited on glass substrates. Optical transmission and reflection is measured from the coated side of the substrate and used to determine the absorption. A distinct absorption peak in the violet wavelength range (380-450 nm) is evident. The observed plasmonic absorption is a signature of Localized Surface Plasmon Resonance, a phenomenon in keeping with the prediction of Effective Medium Theory given the presence of silver nanoparticles in the dielectric layer. Both the peak intensity and peak wavelength decrease with decreasing silver layer thickness, demonstrating the plasmonic absorption wavelength tunability. Additional tunability may be integrated by varying the dielectric composition (for example, through varying hydrogenation level), and as per FIG. 19 and FIG. 20 the dielectric constant of the top hydrogenated metallic nitride layer. In keeping with plasmon frequency dependence on the dielectric constant, varying the dielectric properties can shift the resonance wavelength of the plasmonic peak and thus permit variation in optical properties (for example, designing of different reflection colours).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

REFERENCES

1. Soulen, Robert (March 1996). "James Dewar, His Flask and Other Achievements". *Physics Today.* 49 (3): 32-37.
2. https://en.wikipedia.org/wiki/Thermos_L.L.C.
3. http://www.lamptech.co.uk/Spec%20Sheets/D%20SLP%20GEC%20SLI175% 20Gold.htm
4. http://www.lamptech.co.uk/Spec%20Sheets/D%20SLP%20Philips%20SOX40.htm
5. H. J. J. van Boort and R. Groth, "Low-pressure sodium lamps with indium oxide filter", Philips tech. Rev. 29,17, 1968.
6. H. Köstlin, "Double-glazed windows with very good thermal insulation", Philips tech. Rev. 34, 242-243, 1974, No. 9.
7. John C. C. Fan and Frank J. Bachner, "Transparent heat mirrors for solar-energy applications", Applied Optics Vol. 15, Issue 4, pp. 1012-1017 (1976).
8. Scalora, M., Bloemer, M. J., Pethel, A. S., Dowling, J. P., Bowden, C. M., & Manka, A. S., "Transparent, metallo-dielectric, one-dimensional, photonic band-gap structures", Journal of Applied Physics, 83(5), 2377-2383 (1998).
9. Martin-Palma, R. J., Vazquez, L., & Martinez-Duart, J. M. (1998). Silver-based low-emissivity coatings for architectural windows: Optical and structural properties. Solar Energy Materials and Solar Cells, 53(1), 55-66.

10. Chiba, K., Takahashi, T., Kageyama, T., & Oda, H. (2005). Low-emissivity coating of amorphous diamond-like carbon/Ag-alloy multilayer on glass. Applied Surface Science, 246(1), 48-51.
11. Mahtani, P., Leong, K. R., Xiao, I., Chutinan, A., Kherani, N. P., & Zukotynski, S. (2011). Diamond-like carbon based low-emissive coatings. Solar Energy Materials and Solar Cells, 95(7), 1630-1637.
12. Ferrara, M., Castaldo, A., Esposito, S., D'Angelo, A., Guglielmo, A., & Antonaia, A. (2016). AlN-Ag based low-emission sputtered coatings for high visible transmittance window. Surface and Coatings Technology, 295, 2-7.
13. Hollars, Dennis R. "Method of making sputtered coatings." U.S. Pat. No. 4,421,622. 20 December 1983.
14. Young, P. I. & Wolfe, J. D. Solar control layered coating for glass windows U.S. Pat. No. 4,965,121. October 1990.
15. Oyama, T., Suzuki, K. & Mizuhashi, M. Transparent laminated product U.S. Pat. No. 4,859,532. August 1989.
16. Depauw, J.-M. & Hoyois, J.-C. Coated glazing material U.S. Pat. No. 5,110,662. May 1992.
17. Hartig, K. W. & Lingle, P. J. High performance, durable, low-E glass U.S. Pat. No. 5,344,718. September 1994.
18. Tausch, P. J. & Goodman, R. D. Sputtered multi-layer color compatible solar control coating U.S. Pat. No. 5,332,888. July 1994.
19. Hartig, K. W., Larson, S. L. & Lingle, P. J. Low-E glass coating system and insulating glass units made therefrom U.S. Pat. No. 5,514,476. May 1996.
20. Veerasamy, V. S., Petrmichl, R. H. & Thomsen, S. V. Solar management coating system including protective DLC U.S. Pat. No. 6,764,579. July 2004.
21. Persoone, P., Vlaeminck, K. & Lievens, H. Infra-red reflecting layered structure U.S. Pat. No. 7,709,095. May 2010.
22. Wolfe, J. D., Belkind, A. I. & Laird, R. E. Durable low-emissivity solar control thin film coating U.S. Pat. No. 5,563,734. October 1996.
23. Reutler, P. & Gerardin, H. Substrate provided with a stack having thermal properties U.S. patent application Ser. No. 12/933,240. March 2009
24. Patent, U.S. "20140177042 A1." Novel silver barrier materials for low-emissivity applications (2014).

Therefore what is claimed is:
1. A metallo-dielectric solar control structure comprising:
a transparent substrate;
a multilayer metallo-dielectric coating formed on said transparent substrate, said multilayer metallo-dielectric coating comprising the following sequence of layers:
a first transparent dielectric layer formed on said transparent substrate;
a metal layer formed on said first transparent dielectric layer; and
a second transparent dielectric layer formed on said metal layer;
wherein at least one of said first transparent dielectric layer and said second transparent dielectric layer is a hydrogenated metal nitride dielectric layer; and
wherein said metal layer is sufficiently thin, and wherein each hydrogenated metal nitride dielectric layer comprises an effective hydrogen concentration, such that said structure exhibits transparency of at least 70% in at least a portion of the visible spectrum.
2. The metallo-dielectric solar control structure according to claim 1 wherein at least one hydrogenated metal nitride dielectric layer is a hydrogenated aluminum nitride layer.

3. The metallo-dielectric solar control structure according to claim 1 wherein the hydrogen concentration of within at least one hydrogenated metal nitride dielectric layer is between 1 ppm and 1000 ppm by weight.
4. The metallo-dielectric solar control structure according to claim 1 wherein the hydrogen concentration within at least one hydrogenated metal nitride dielectric layer is spatially graded in a direction parallel to a surface normal associated with said transparent substrate.
5. The metallo-dielectric solar control structure according to claim 1 wherein a minimum extinction coefficient in the visible spectrum is less than 0.02.
6. The metallo-dielectric solar control structure according to claim 1 wherein a refractive index of at least one hydrogenated metal nitride dielectric layer is between 1.5 and 1.8.
7. The metallo-dielectric solar control structure according to claim 1 wherein a resistivity of said metal layer is between 2 and 6 microOhm cm.
8. The metallo-dielectric solar control structure according to claim 1 wherein fan average grain size of at least one hydrogenated metal nitride dielectric layer is less than 30 nm.
9. The metallo-dielectric solar control structure according to claim 1 wherein a full width half maximum of a distribution of grain sizes within at least one hydrogenated metal nitride dielectric layer, in a growth direction of said at least one hydrogenated metal nitride dielectric layer, is less than 3 nm.
10. The metallo-dielectric solar control structure according to claim 1 wherein said metal layer is a silver layer.
11. The metallo-dielectric solar control structure according to claim 1 wherein a thickness of said metal layer is between 3 nm and 30 nm.
12. The metallo-dielectric solar control structure according to claim 1 wherein said metal layer is sufficiently thin, and each hydrogenated metal nitride dielectric layer comprises an effective concentration of hydrogen, such that said metallo-dielectric solar control structure exhibits transparency of at least 70% in at least a portion of the visible spectrum, and reflectivity of at least 85% in a least a portion of the infrared spectrum.
13. The metallo-dielectric solar control structure according to claim 1 wherein said multilayer metallo-dielectric coating further comprises busbars in electrical communication with said metal layer and an electrical power source.
14. The metallo-dielectric solar control structure according to claim 1 wherein said first transparent dielectric layer is a first hydrogenated metal nitride dielectric layer and said second transparent dielectric layer is a second hydrogenated metal nitride dielectric layer.
15. The metallo-dielectric solar control structure according to claim 14 wherein said metal layer and said second hydrogenated metal nitride dielectric layer form a metallo-dielectric bilayer, and wherein said multilayer metallo-dielectric coating further comprises one or more additional metallo-dielectric bilayers.
16. The metallo-dielectric solar control structure according to claim 15 wherein the hydrogen concentration within at least one hydrogenated metal nitride dielectric layer of said multilayer metallo-dielectric coating is spatially graded in a direction parallel to a surface normal associated with said transparent substrate.
17. The metallo-dielectric solar control structure according to claim 1 wherein a metal-dielectric interface between said metal layer and one or more of said first transparent dielectric layer and said second transparent dielectric layer is characterized by nanoscale roughness.

18. The metallo-dielectric solar control structure according to claim 17 wherein said roughness is configured to generate at least one plasmonic feature is an absorption spectrum of said structure.

19. The metallo-dielectric solar control structure according to claim 1 wherein one or more of said first transparent dielectric layer and said second transparent dielectric layer comprises a distribution of metallic nanoparticles.

20. The metallo-dielectric solar control structure according to claim 19 wherein said metallic nanoparticles have a size and composition configured to generate at least one plasmonic feature is an absorption spectrum of said structure.

21. A vehicle windshield comprising a solar control structure according to claim 1.

22. The vehicle windshield according to claim 21 wherein said multilayer metallo-dielectric coating further comprises busbars in electrical communication with said metal layer and an electrical power source.

23. A vehicle comprising:
a vehicle windshield according to claim 22;
the electrical power source; and
control circuitry configured to deliver an electrical current to said metal layer over a time duration suitable for deicing said vehicle windshield.

24. A vehicle comprising:
a vehicle windshield according to claim 22;
the electrical power source; and
control circuitry configured to deliver an electrical current to said metal layer over a time duration suitable for defogging said vehicle windshield.

25. A method of fabricating a metallo-dielectric coating on a transparent substrate, the method comprising:
depositing, onto the transparent substrate, a first transparent dielectric layer;
depositing a metal layer onto the first transparent dielectric layer such that the metal layer forms a continuous film in the absence of isolated islands; and
depositing a second transparent dielectric layer onto the metal layer;
wherein at least one of said first transparent dielectric layer and said second transparent dielectric layer is a hydrogenated metal nitride dielectric layer formed by the deposition of a metal nitride layer in the presence of hydrogen;
wherein a thickness of the metal layer, and a hydrogen concentration of each hydrogenated metal nitride dielectric layer, are selected such that the metallo-dielectric coating exhibits a transparency of at least 70% in at least a portion of the visible spectrum.

26. The method according to claim 25 wherein each hydrogenated metal nitride dielectric layer is formed via a sputtering process in the presence of hydrogen gas.

27. The method according to claim 25 wherein the hydrogen concentration during formation of at least one hydrogenated metal nitride dielectric layer is between 1% and 10% by volume.

28. The method according to claim 26 wherein the hydrogen concentration during formation of at least one hydrogenated metal nitride dielectric layer is between 0.25% and 20% by volume.

29. The method according to claim 26 wherein the hydrogen concentration during formation of at least one hydrogenated metal nitride dielectric layer is between 0.25% and 2.5% by volume.

30. The method according to claim 26 wherein the hydrogen concentration during formation of at least one hydrogenated metal nitride dielectric layer is between 0.25% and 5% by volume.

31. The method according to claim 25 wherein at least one hydrogenated metal nitride dielectric layer is formed having a hydrogen concentration between 1 ppm and 1000 ppm by weight.

32. The method according to claim 25 wherein a hydrogen concentration within at least one hydrogenated metal nitride dielectric layer is spatially graded in a direction parallel to a surface normal associated with the transparent substrate.

33. The method according to claim 25 wherein the first transparent dielectric layer forms a first hydrogenated metal nitride dielectric layer and said second transparent dielectric layer forms a second hydrogenated metal nitride dielectric layer.

34. The method according to claim 33 wherein the metal layer and said second hydrogenated metal nitride dielectric layer form a metallo-dielectric bilayer, the method further comprising depositing one or more additional metallo-dielectric bilayers.

35. The method according to claim 34 wherein a hydrogen concentration within at least one hydrogenated metal nitride dielectric layer is spatially graded in a direction parallel to a surface normal associated with the transparent substrate.

36. A method of fabricating a metallo-dielectric coating on a transparent substrate, the method comprising:
depositing, onto the transparent substrate, a first transparent dielectric layer;
depositing a metal layer onto the first transparent dielectric layer such that the metal layer forms a continuous film in the absence of isolated islands; and
depositing a second transparent dielectric layer onto the metal layer;
wherein at least one of said first transparent dielectric layer and said second transparent dielectric layer is a metal nitride dielectric layer;
performing post-deposition hydrogenation such that at least one metal nitride dielectric layers becomes a hydrogenated metal nitride dielectric layer;
wherein a thickness of the metal layer, and a hydrogen concentration of each hydrogenated metal nitride dielectric layer, are selected such that the metallo-dielectric coating exhibits a transparency of at least 70% in at least a portion of the visible spectrum.

37. The method according to claim 36 wherein each metal nitride dielectric layer is formed via a sputtering process.

38. The method according to claim 36 wherein post-deposition hydrogenation is performed such that at least one hydrogenated metal nitride dielectric layer has a hydrogen concentration between 1 ppm and 1000 ppm by weight.

39. The method according to claim 36 wherein a hydrogen concentration within at least one hydrogenated metal nitride dielectric layer is spatially graded in a direction parallel to a surface normal associated with the transparent substrate.

40. The method according to claim 36 wherein the first transparent dielectric layer forms a first hydrogenated metal nitride dielectric layer, and said second transparent dielectric layer forms a second hydrogenated metal nitride dielectric layer.

41. The method according to claim 40 wherein the metal layer and said second hydrogenated metal nitride dielectric layer form a metallo-dielectric bilayer, the method further comprising depositing one or more additional metallo-dielectric bilayers.

42. The method according to claim 40 wherein a hydrogen concentration within at least one hydrogenated metal nitride dielectric layer is spatially graded in a direction parallel to a surface normal associated with the transparent substrate.

43. The method according to claim 36 wherein post-deposition hydrogenation is performed at a temperature sufficiently high to permit bending of the transparent substrate.

44. A metallo-dielectric solar control structure comprising:
   a transparent substrate;
   a multilayer metallo-dielectric coating formed on said transparent substrate, said multilayer metallo-dielectric coating comprising the following sequence of layers:
      a first transparent dielectric layer formed on said transparent substrate;
      a metal layer formed on said first transparent dielectric layer; and
      a second transparent dielectric layer formed on said metal layer;
   wherein at least one of said first transparent dielectric layer and said second transparent dielectric layer is a hydrogenated metal nitride dielectric layer.

45. The metallo-dielectric solar control structure according to claim 44 wherein a metal-dielectric interface between said metal layer and one or more of said first transparent dielectric layer and said second transparent dielectric layer is characterized by nanoscale roughness.

46. The metallo-dielectric solar control structure according to claim 45 wherein said roughness is configured to generate at least one plasmonic feature is an absorption spectrum of said structure.

47. The metallo-dielectric solar control structure according to claim 44 wherein one or more of said first transparent dielectric layer and said second transparent dielectric layer comprises a distribution of metallic nanoparticles.

48. The metallo-dielectric solar control structure according to claim 47 wherein said metallic nanoparticles have a size and composition configured to generate at least one plasmonic feature is an absorption spectrum of said structure.

* * * * *